(12) United States Patent
Choi et al.

(10) Patent No.: US 8,514,621 B2
(45) Date of Patent: Aug. 20, 2013

(54) FLASH MEMORY DEVICE AND SYSTEM WITH PROGRAM SEQUENCER, AND PROGRAMMING METHOD

(75) Inventors: Ki Hwan Choi, Seongnam-si (KR); Sung Soo Lee, Seongnam-si (KR); Jae-Woo Park, Suwon-si (KR); Sang-Hyun Joo, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 322 days.

(21) Appl. No.: 13/089,639

(22) Filed: Apr. 19, 2011

(65) Prior Publication Data

US 2011/0292725 A1 Dec. 1, 2011

Related U.S. Application Data

(60) Provisional application No. 61/350,049, filed on Jun. 1, 2010.

(30) Foreign Application Priority Data

Jun. 1, 2010 (KR) .................. 10-2010-0051748

(51) Int. Cl.
*G11C 11/34* (2006.01)
*G11C 16/04* (2006.01)
(52) U.S. Cl.
USPC ............ 365/185.03; 365/185.12; 365/185.18; 365/185.22; 365/185.24

(58) Field of Classification Search
USPC ............. 365/185.03, 185.12, 185.18, 185.22, 365/185.24
See application file for complete search history.

(56) References Cited

U.S. PATENT DOCUMENTS 8,179,727 B2 * 5/2012 Kim .......................... 365/185.24
2008/0310226 A1 * 12/2008 Kang et al. ............... 365/185.03

FOREIGN PATENT DOCUMENTS

KR 100763353 B1 9/2007
KR 1020110023333 A 3/2011

OTHER PUBLICATIONS

Takeuchi, Ken et al., "A Negative Vth Cell Architecture for Highly Scalable, Excellently Noise-Immune, and Highly Reliable NAND Flash Memories", IEEE Journal of Solid-State Circuits, vol. 34, No. 5, May 1999, pp. 675-684.

* cited by examiner

*Primary Examiner* — Toan Le
(74) *Attorney, Agent, or Firm* — Volentine & Whitt, PLLC

(57) ABSTRACT

A programming method for a nonvolatile memory device includes performing a LSB programming operation programming all LSB logical pages, and thereafter performing a MSB programming operation programming all MSB logical pages, wherein during the LSB programming operation a selected MLC is programmed to a negative intermediate program state. A program sequence for the LSB and MSB programming operations may be sequential or non-sequential in relation to an order arranged of word lines.

23 Claims, 33 Drawing Sheets

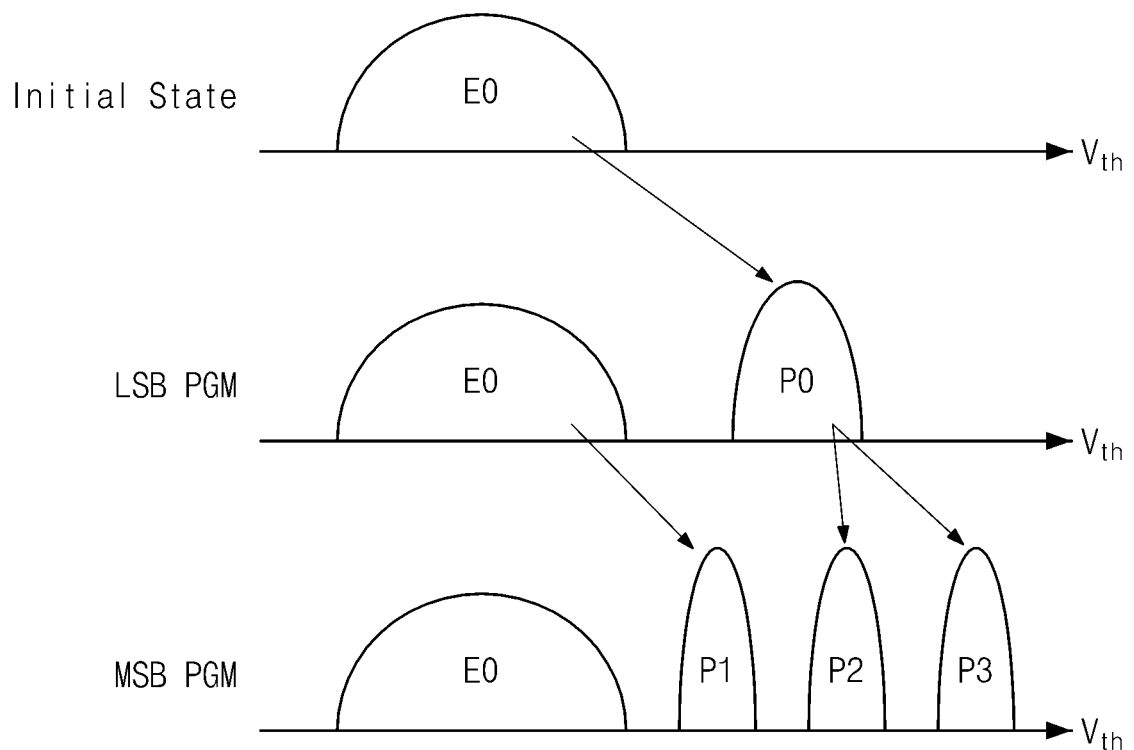

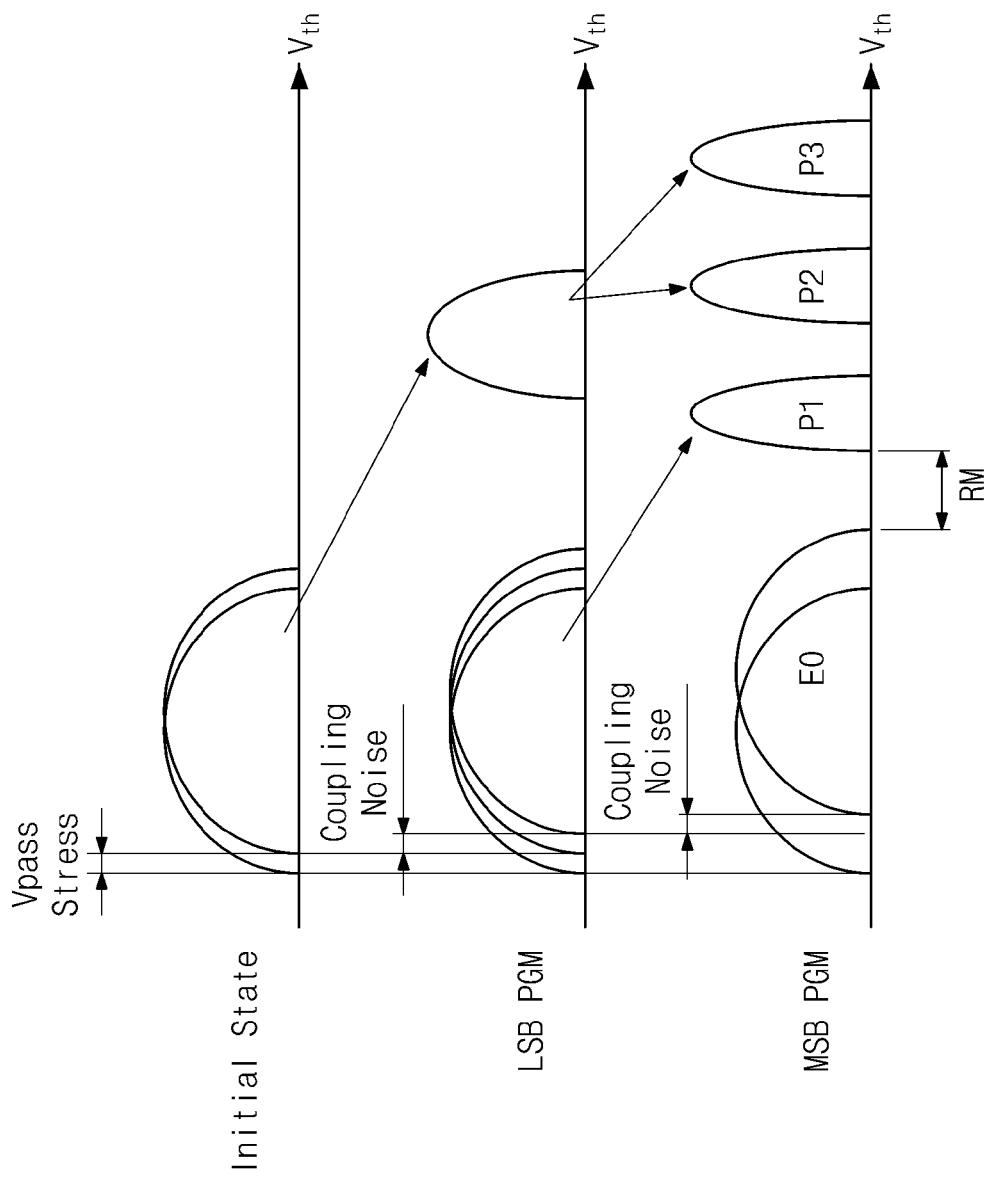
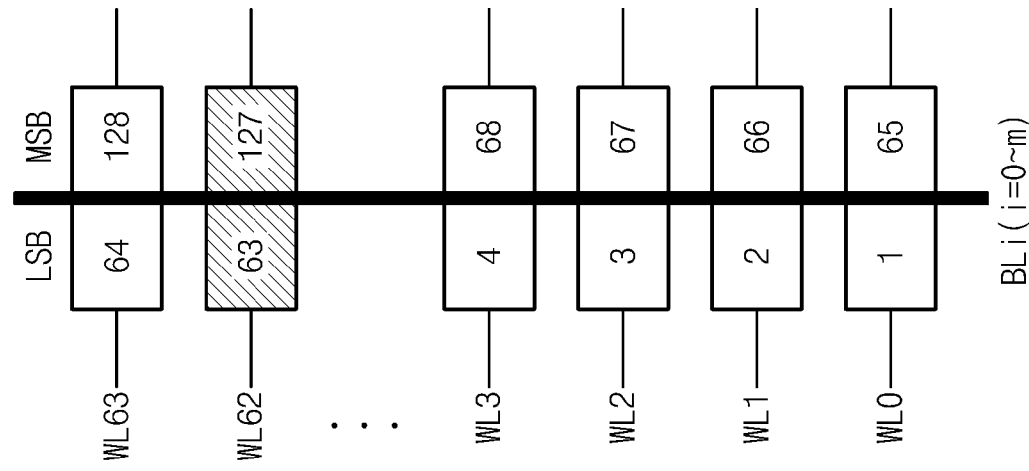

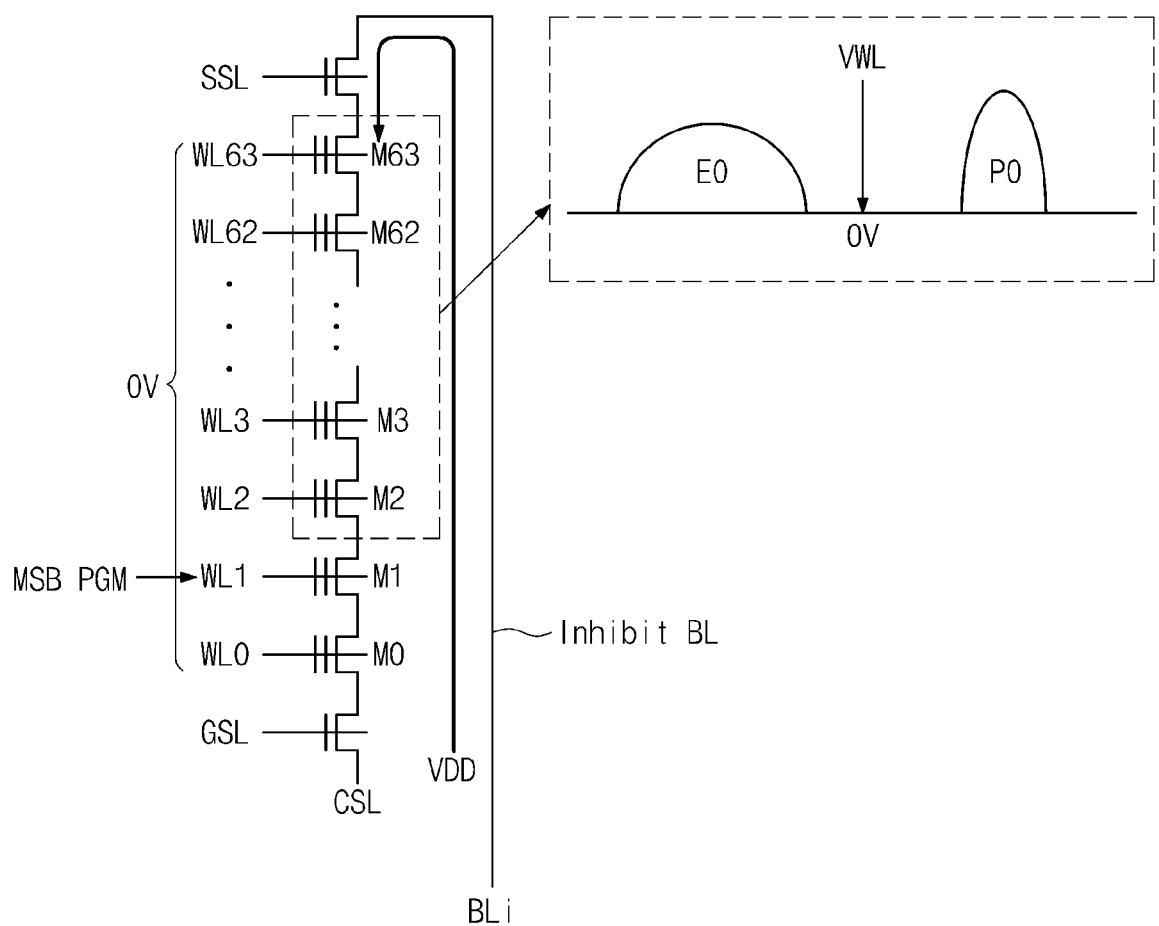

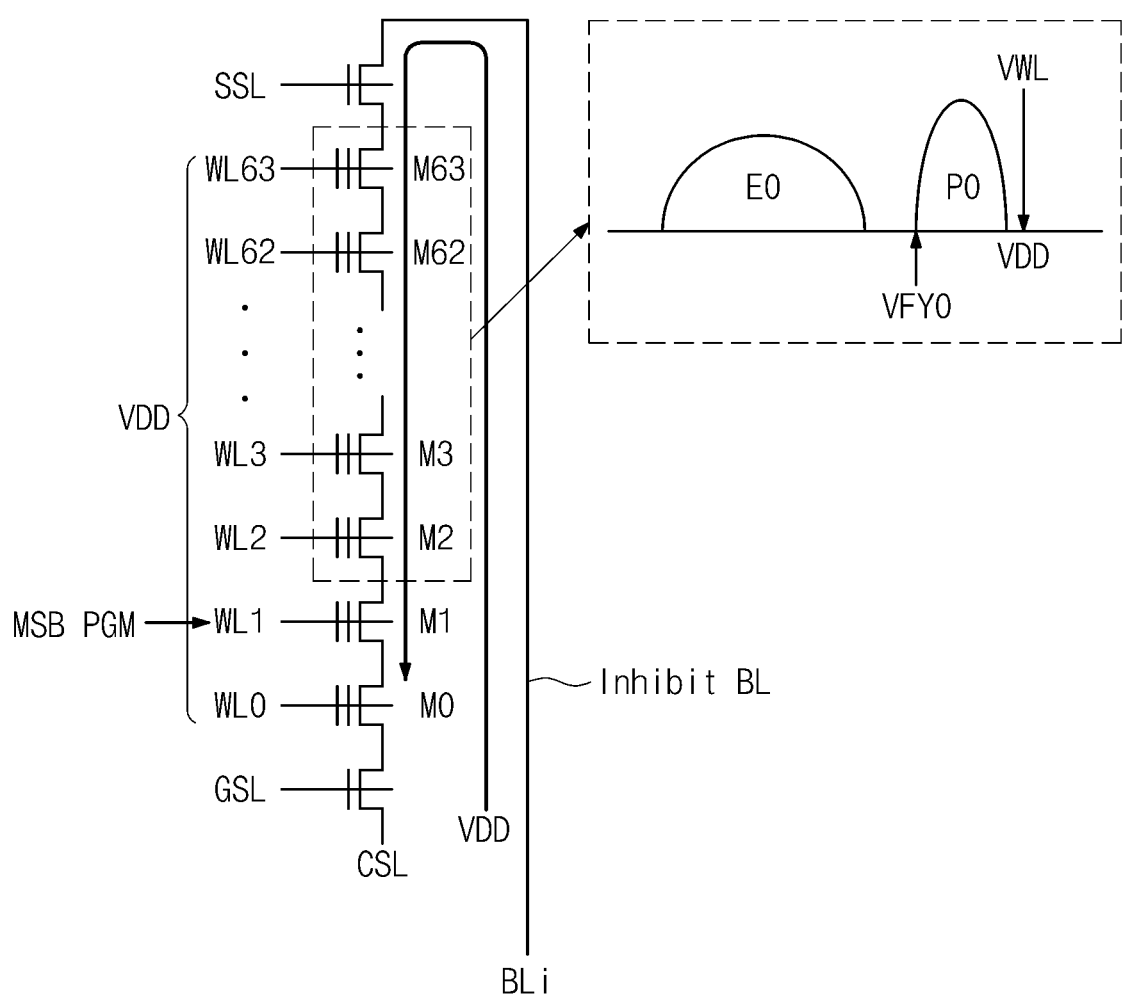

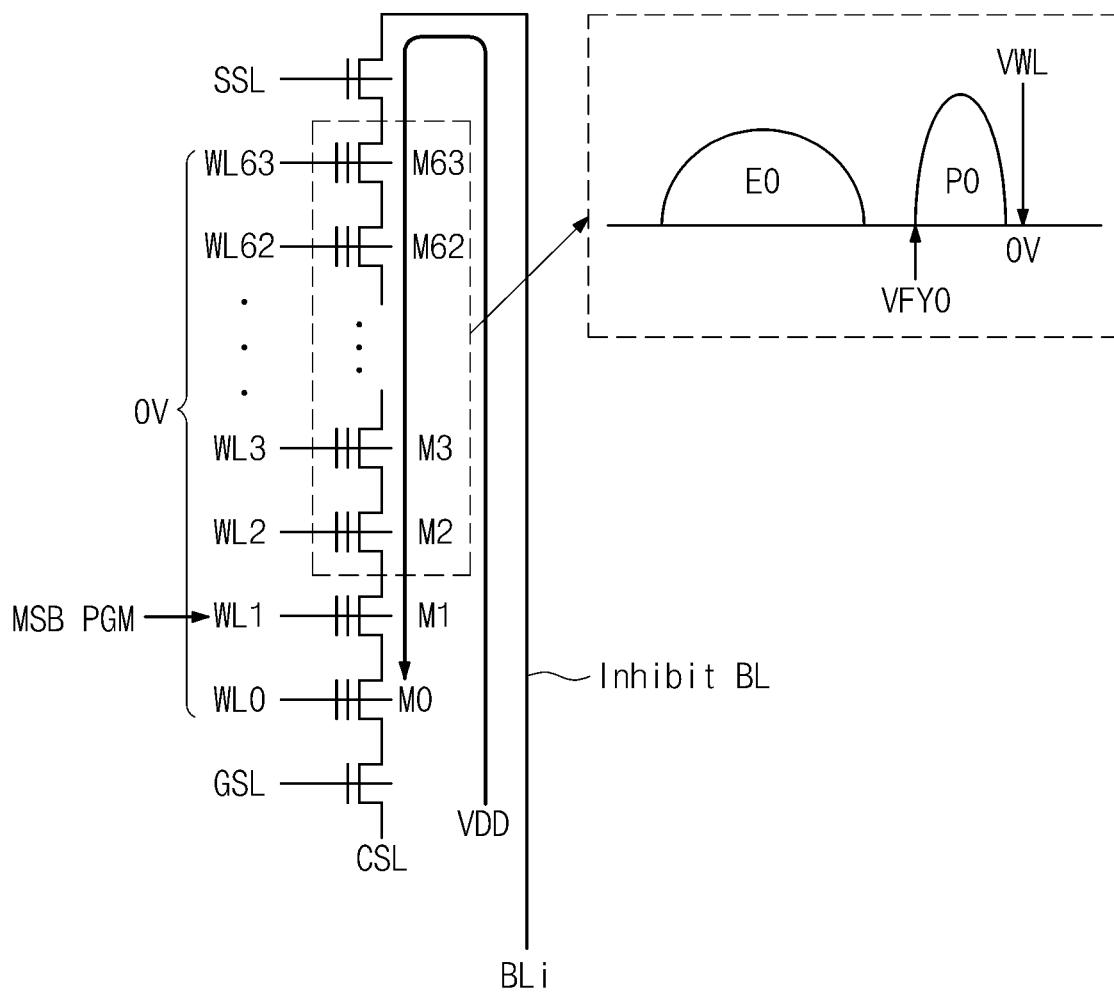

$$\begin{cases} V_{th}=a3, & LAT=0 \\ V_{th}=b3, & LAT=1 \end{cases}$$

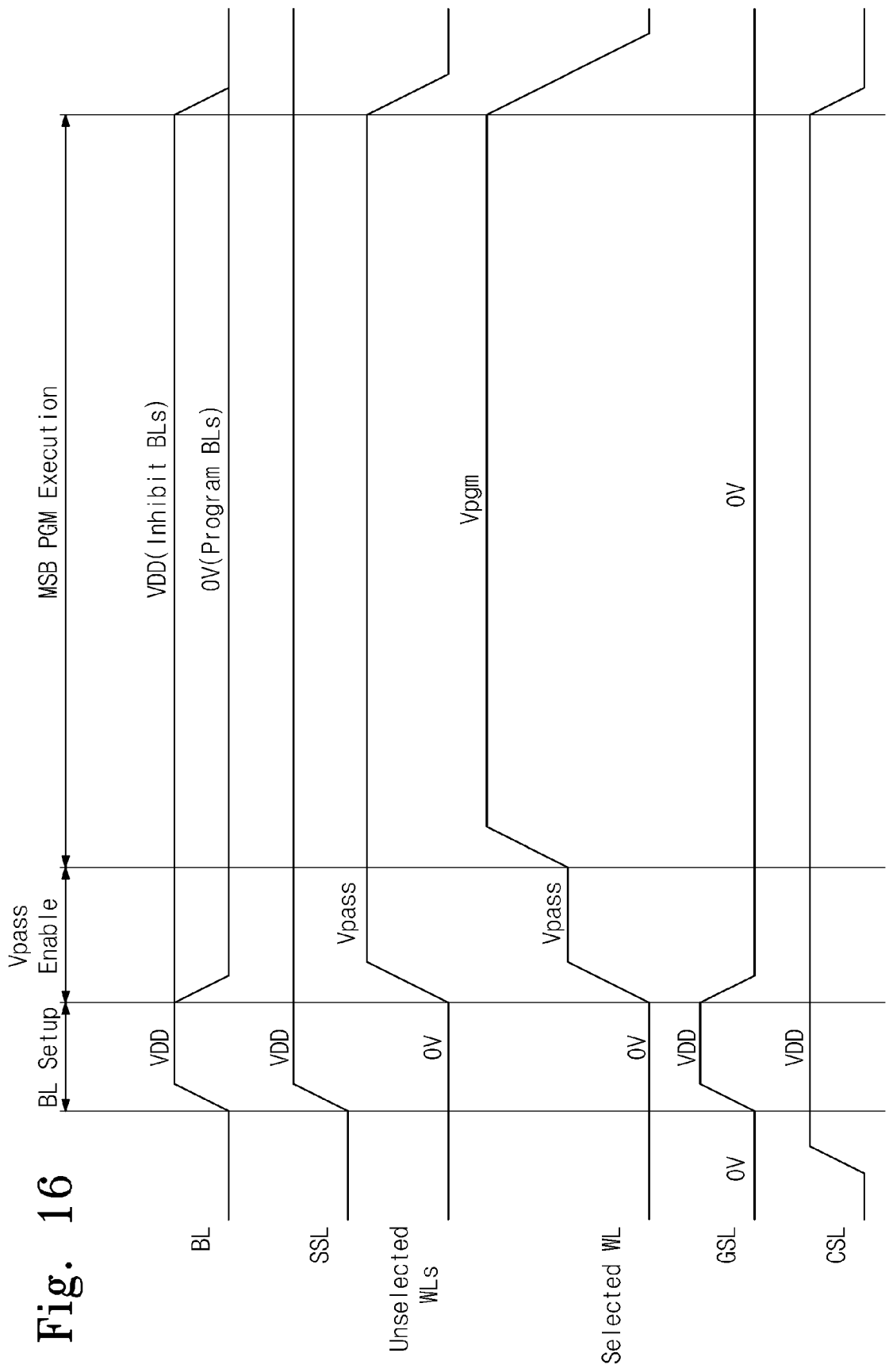

FLASH MEMORY DEVICE AND SYSTEM WITH PROGRAM SEQUENCER, AND PROGRAMMING METHOD

CROSS-REFERENCE TO RELATED APPLICATIONS

This U.S. non-provisional patent application claims priority under 35 U.S.C. §119 to Korean Patent Application No. 10-2010-0051748 filed Jun. 1, 2010, the subject matter of which is hereby incorporated by reference.

BACKGROUND OF THE INVENTION

The present disclosure relates to semiconductor memory devices, and more particularly, to flash memory devices including a program sequencer. The present disclosure also relates to memory systems incorporating this type of flash memory device, as well as related programming methods.

Generally, semiconductor memory devices may be divided into volatile memories such as Dynamic Random Access Memory (DRAM) and Static Random Access Memory (SRAM), and nonvolatile memories such as Electrical Erasable Programmable Read Only Memory (EEPROM)—including flash memory, Ferroelectric Random Access Memory (FRAM), Phase-change Random Access Memory (PRAM), and Magneto-resistive Random Access Memory (MRAM). Of the many different types of semiconductor memory devices, flash memory devices exhibit a unique combination of high programming speed, low power consumption, dense memory cell integration, and nonvolatile data storage. As a result, flash memory devices have been widely adopted for use as a storage medium in all sorts of consumer electronics and digital data systems.

Contemporary flash memory devices are capable of storing a single data bit per memory cell in single-level memory cells (SLCs), and/or two or more data bits per memory cell in multi-level memory cells (MLCs). Thus, a SLC stores data binary having either an erase state or a programmed state according to corresponding threshold voltage distributions. A MLC stores multi-bit data having either an erase state or one of multiple programmed states according to corresponding threshold voltage distributions.

Stored data is read from a SLC or MLC during read (or verify) operations in accordance with respective threshold voltage distributions using one or more reference voltages that effectively discriminate between the threshold voltage distributions. The voltage separation between adjacent threshold voltage distributions is referred to as "read margin."

Unfortunately, as the number of valid states in MLCs increases, the various read margins between adjacent threshold voltage distributions are reduced. Further challenging the proper execution of read (verify) operations (e.g., the maintenance of defined read margins) is the fact that threshold voltage distributions may change over time in response to a number of influences. For example, the execution of a programming operation, an erase operation and/or a read operation directed to a target memory cell may unintentionally change (e.g., shift, expand or reduce) the threshold voltage of an adjacent memory cell (i.e., a memory cell physically proximate the target memory cell in a memory cell array). In certain worse case scenarios, adjacent threshold voltage distributions intended to clearly indicate different erase/programming states may actually overlap making it impossible to discriminate one data state from the other. As a result, a read operation failure may arise. Other factors potentially changing the threshold voltage of memory cells in a memory cell array include; coupling noise effects, pass voltage disturbance effects, and programming voltage disturbance effects to name but a few examples.

SUMMARY OF THE INVENTION

Embodiments of the inventive concept provide flash memory devices, flash memory systems, and related programming methods that reduce or eliminate such unintentional change of the memory cell threshold voltages during programming operations.

In one embodiment, the inventive concept provides a programming method for a nonvolatile memory device. The nonvolatile memory device comprises multi-level memory cells (MLCs) arranged in N-physical pages (PPs), each PP being respectively associated with one of N word lines (WLs) disposed in a consecutive arrangement order, the MLCs being further arranged in 2N logical pages (LPs), wherein each PP comprises a Most Significant Bit (MSB) LP and a Least Significant Bit (LSB) LP. The method comprises performing a LSB programming operation programming all of the LSB LPs, and thereafter performing a MSB programming operation programming all of the MSB LPs, wherein during the LSB programming operation a selected MLC connected between a selected word line and selected bit line is programmed to a negative intermediate program state.

In a related aspect, the method may further comprise establishing a bias voltage condition during the LSB programming operation such that the intermediate program state is negative. This may be accomplished, for example, by applying a negative word line voltage to the selected word line and applying a power source voltage to the selected bit line while applying a ground voltage to a common source line connected to the selected bit line. In one alternative, this may be accomplished by applying a grounded word line voltage to the selected word line while applying a power source voltage to a common source line connected to the selected bit line. In another alternative, this may be accomplished by applying a grounded word line voltage to the selected word line and applying a power source voltage to the selected bit line while applying a positive bias voltage less than the power supply voltage to a common source line connected to the selected bit line. It is possible that the positive bias voltage be equal in level to an absolute value of the level of a negative program verification voltage used to discriminate between the erase state and the negative intermediate program state during a program verification operation.

In another related aspect, performing the LSB programming operation may comprise; during a LSB bit line setup period applying a grounded voltage to all of the word lines, during a Vpass enable period applying a Vpass voltage to all of the word lines, and thereafter during a LSB program execution period, continuing to apply the Vpass voltage to unselected word lines other than the selected word line while applying an iterative programming voltage to the selected word line, wherein each iterative application of the programming voltage to the selected word line comprises applying a negative verification voltage discriminating between an erase state and the negative intermediate program state.

In another related aspect, following the MSB programming operation the selected MLC is programmed to one of a group of data states consisting of; an erase state having a negative threshold voltage distribution, a first program state having a first voltage distribution greater than that of the erase state, a second program state having a voltage distribution greater than that of the first program state, and a third program state having a voltage distribution greater than that of the second program state. At least the first program state may be negative.

In another related aspect, performing the MSB programming operation may comprise; during a MSB bit line setup period applying a power supply voltage greater than a threshold voltage distribution for the intermediate program state to all of the word lines, during a Vpass enable period applying a Vpass voltage to all of the word lines, and thereafter during a MSB program execution period, continuing to apply the Vpass voltage to unselected word lines other than the selected word line while applying an iterative programming voltage to the selected word line. Each iterative application of the programming voltage to the selected word line may comprise applying a first program verification voltage discriminating between the negative threshold voltage distribution and the first voltage distribution, applying a second program verification voltage discriminating between the first voltage distribution and the second voltage distribution, and applying a third program verification voltage discriminating between the second threshold voltage distribution and the third voltage distribution, wherein at least the first program verification voltage is negative. The first and/or second verification voltages may be negative.

In another related aspect, the LSB programming operation and/or the MSB programming operation may comprise sequentially programming each one of the LSB (or MSB) LPs in the arrangement order of the N word lines.

In another related aspect, the MSB programming operation may comprise applying a power source voltage having a level greater than a threshold voltage distribution for the intermediate program state to all unselected word lines other than the selected word line during a MSB bit line setup period, and thereafter applying an iterative programming voltage, which may include applying a negative verification voltage, to the selected word line.

In another related aspect, the MSB programming operation may comprise; applying a grounded voltage having a level greater than a threshold voltage distribution for the intermediate program state to all unselected word lines other than the selected word line during a MSB bit line setup period, and thereafter applying an iterative programming voltage to the selected word line.

In another related aspect, the LSB programming operation and/or the MSB programming operation may comprise non-sequentially programming each one of the LSB (or MSB) LPs in an non-sequential order other than the arrangement order of the N word lines. One non-sequential order may comprise beginning with a N/2 center word line and then alternating between even LPs arranged incrementally above the center word line and odd LPs arranged incrementally below the center word line. Another non-sequential order may comprise beginning with a lowest and first even word line, transitioning to each incrementally successive even word line through the arrangement order, then beginning with a next lowest and first odd word line, transitioning to each incrementally successive odd word line through the arrangement order.

In another embodiment, the inventive concept provides a nonvolatile memory device comprising; a memory cell array comprising multi-level memory cells (MLCs) arranged in a plurality of physical pages (PPs), each PP being respectively associated with one of N word lines (WLs) disposed in a consecutive arrangement order, the MLCs being further arranged in a plurality of logical pages (LPs), wherein each PP comprises a Most Significant Bit (MSB) LP and a Least Significant Bit (LSB) LP, and control logic comprising a program sequencer, wherein the control logic controls execution of a programming operation including a LSB programming operation and a MSB programming operation directed to a selected MLC connected between a selected word line among the N word lines and a selected bit line, wherein during the LSB programming operation the program sequencer causes all LSB LPs to be programmed, and thereafter during the MSB programming operation the program sequencer causes all MSB LPs to be programmed, and during the LSB programming operation the control logic causes the selected MLC to be programmed to a negative intermediate program state.

In another embodiment, the inventive concept provides a memory system comprising; a memory controller controlling the operation of a nonvolatile memory device in response to a command received from a host, wherein the nonvolatile memory device comprises; a memory cell array comprising multi-level memory cells (MLCs) arranged in a plurality of physical pages (PPs), each PP being respectively associated with one of N word lines (WLs) disposed in a consecutive arrangement order, the MLCs being further arranged in a plurality of logical pages (LPs), wherein each PP comprises a Most Significant Bit (MSB) LP and a Least Significant Bit (LSB) LP, control logic comprising a program sequencer, the control logic controlling execution of a programming operation including a LSB programming operation and a MSB programming operation directed to a selected MLC connected between a selected word line among the N word lines and a selected bit line, wherein during the LSB programming operation the program sequencer causes all LSB LPs to be programmed, and thereafter during the MSB programming operation the program sequencer causes all MSB LPs to be programmed, and during the LSB programming operation the control logic causes the selected MLC to be programmed to a negative intermediate program state.

In a related aspect the memory controller and the nonvolatile memory device may be configured as a memory card capable of being mechanically connected and disconnected form the host, and the memory controller may comprise; a host interface that exchanges data from the host, and a nonvolatile memory interface that exchanges data with the nonvolatile memory device.

In another related aspect, the host interface comprises a card connection unit that receives at least one of data to be programmed to the nonvolatile memory device, the command controlling operation of the nonvolatile memory device and a clock signal from a host connection unit of the host.

In another embodiment, the inventive concept provides an electronic device comprising; a Central Processing Unit (CPU) that controls an exchange of data between at least one of a Random Access Memory (RAM) and a user interface and a nonvolatile memory system. The nonvolatile memory system may comprises; a memory controller controlling operation of a nonvolatile memory device in response to a command from the CPU, and the nonvolatile memory device may comprise; a memory cell array comprising multi-level memory cells (MLCs) arranged in a plurality of physical pages (PPs), each PP being respectively associated with one of N word lines (WLs) disposed in a consecutive arrangement order, the MLCs being further arranged in a plurality of logical pages (LPs), wherein each PP comprises a Most Significant Bit (MSB) LP and a Least Significant Bit (LSB) LP, and control logic comprising a program sequencer, the control logic controlling execution of a programming operation including a LSB programming operation and a MSB programming operation directed to a selected MLC connected between a selected word line among the N word lines and a selected bit line, wherein during the LSB programming operation the program sequencer causes all LSB LPs to be programmed, and thereafter during the MSB programming operation the program sequencer causes all MSB LPs to be programmed, and during the LSB programming operation the control logic causes the selected MLC to be programmed to a negative intermediate program state.

In another embodiment, the inventive concept provides a system comprising; a host configured to communicate data, an address, and a command to an operatively connected Solid State Drive (SSD). The SSD may comprise; a SSD controller that controls operation of a plurality of nonvolatile memory devices in response to the command. Each one of the plurality of nonvolatile memory devices may comprise; a memory cell array comprising multi-level memory cells (MLCs) arranged in a plurality of physical pages (PPs), each PP being respectively associated with one of N word lines (WLs) disposed in a consecutive arrangement order, the MLCs being further arranged in a plurality of logical pages (LPs), wherein each PP comprises a Most Significant Bit (MSB) LP and a Least Significant Bit (LSB) LP, and control logic comprising a program sequencer, the control logic controlling execution of a programming operation including a LSB programming operation and a MSB programming operation directed to a selected MLC connected between a selected word line among the N word lines and a selected bit line, wherein during the LSB programming operation the program sequencer causes all LSB LPs to be programmed, and thereafter during the MSB programming operation the program sequencer causes all MSB LPs to be programmed, and during the LSB programming operation the control logic causes the selected MLC to be programmed to a negative intermediate program state.

In a related aspect, the plurality of nonvolatile memory devices may be operatively arranged according to a plurality of channels, such that the SSD controller controls operation of a plurality of nonvolatile memory devices according to a multichannel configuration.

In another related aspect, the SSD controller may comprise a host interface that receives the data from the host, a memory interface that receives data from the plurality of nonvolatile memory devices via the multichannel configuration, and a Central Processing Unit (CPU) that controls an exchange of data between the host and the plurality of nonvolatile memory devices via the host interface and the memory interface.

In yet another aspect, the SSD may further comprise an auxiliary power supply that powers operation of the SSD controller and is connected to a power source provided by the host.

In another embodiment, the inventive concept provides a nonvolatile memory device comprising; a three-dimensional memory cell array of multi-level memory cells (MLCs) arranged in a plurality of memory blocks, each memory block being further arranged in a plurality of physical pages (PPs), each PP being respectively associated with one of N word lines (WLs) disposed in a consecutive arrangement order, the MLCs being further arranged in a plurality of logical pages (LPs), wherein each PP comprises a Most Significant Bit (MSB) LP and a Least Significant Bit (LSB) LP, and control logic comprising a program sequencer, wherein the control logic controls execution of a programming operation including a LSB programming operation and a MSB programming operation directed to a selected MLC connected between a selected word line among the N word lines and a selected bit line, wherein during the LSB programming operation the program sequencer causes all LSB LPs to be programmed, and thereafter during the MSB programming operation the program sequencer causes all MSB LPs to be programmed, and during the LSB programming operation the control logic causes the selected MLC to be programmed to a negative intermediate program state.

In another embodiment, the inventive concept provides a nonvolatile memory device comprising; a voltage generator that generates a plurality of control voltages in response to a command received from a host, an address decoder that receives the plurality of control voltages and controls execution of a programming operation in relation to a memory cell array, the memory cell array comprising multi-level memory cells (MLCs) arranged in a plurality of physical pages (PPs), each PP being respectively associated with one of N word lines (WLs) disposed in a consecutive arrangement order, the MLCs being further arranged in a plurality of logical pages (LPs), wherein each PP comprises a Most Significant Bit (MSB) LP and a Least Significant Bit (LSB) LP, control logic comprising a program sequencer and further controlling execution of the programming operation including a LSB programming operation and a MSB programming operation directed to a selected MLC connected between a selected word line among the N word lines and a selected bit line, wherein during the LSB programming operation the program sequencer causes all LSB LPs to be programmed, and thereafter during the MSB programming operation the program sequencer causes all MSB LPs to be programmed, and during the LSB programming operation the control logic causes the selected MLC to be programmed to a negative intermediate program state, and a page buffer circuit that stores data to be programmed during the programming operation.

In a related aspect, the voltage generator may comprise a negative voltage generator that generates a negative program verification voltage applied to the selected word line via the address decoder during a program verification operation of the LSB programming operation while a power source voltage is applied to the selected bit line.

In another aspect, the nonvolatile memory device may further comprises a common source line driver that applies a grounded voltage to a common source line connected to the selected bit line during the program verification operation of the LSB programming operation while the negative program verification voltage is applied to the selected word line and the grounded voltage is applied to the selected bit line, such that a latch in the page buffer circuit latches either program continuance data or program terminating data.

In yet another aspect, the voltage generator may comprise a low voltage generator that generates a grounded program verification voltage applied to the selected word line via the address decoder during a program verification operation of the LSB programming operation.

In yet another aspect, the nonvolatile memory device may further comprise a common source line driver that applies a power source voltage to a common source line connected to the selected bit line during the program verification operation of the LSB programming operation while the grounded program verification voltage is applied to the selected word line, such that a latch in the page buffer circuit latches either program continuance data or program terminating data.

In still another aspect the latch may comprise a comparator that receives a bit line voltage from the selected bit line and a program target voltage and provides a comparison result to the latch.

In still another aspect, the voltage generator may comprise a low voltage generator that generates a grounded program verification voltage applied to the selected word line via the address decoder during a program verification operation of the LSB programming operation while a power source voltage is applied to the selected bit line.

In still another aspect, the nonvolatile memory device may further comprise a common source line driver that applies a voltage less than the power source voltage to a common source line connected to the selected bit line during the program verification operation of the LSB programming operation while the grounded program verification voltage is applied to the selected word line, such that a latch in the page buffer circuit latches either program continuance data or program terminating data

BRIEF DESCRIPTION OF THE DRAWINGS

The accompanying drawings are included to provide a further understanding of the inventive concept, and are incorporated in and constitute a part of the specification. The drawings illustrate exemplary embodiments of the inventive concept and, together with the written description, serve to explain principles of the inventive concept. In the drawings:

FIG. 3 is a threshold voltage distribution diagram illustrating one possible approach to the programming of an exemplary 2-bit flash memory cell;

FIG. 4, inclusive of FIGS. 4A and 4B, illustrates one possible program sequence for the flash memory device of FIG. 2;

FIG. 5, inclusive of FIGS. 5A and 5B, illustrates one possible approach to operating the flash memory device of FIG. 2 according to the program sequence of FIG. 4 with a decreased probability of a Vpgm disturbance;

FIG. 6, inclusive of FIGS. 6A and 6B, illustrates another possible approach to operating the flash memory device of FIG. 2 according to the program sequence of FIG. 4 with a decreased probability of a Vpgm disturbance;

FIG. 7, inclusive of FIGS. 7A and 7B, illustrates yet another possible approach to operating the flash memory device of FIG. 2 according to the program sequence of FIG. 4 with a decreased probability of a Vpgm disturbance;

FIG. 16 is a timing diagram further illustrating a MSB programming operation compatible with the programming approach of FIGS. 14 and 15;

DETAILED DESCRIPTION OF THE EMBODIMENTS

Exemplary embodiments of the inventive concept will be described below in some additional detail with reference to the accompanying drawings. The inventive concept may, however, be embodied in many different forms and should not be construed as being limited to only the embodiments set forth herein. Rather, these embodiments are provided so that this disclosure will be thorough and complete, and will fully convey the scope of the inventive concept to those skilled in the art.

As has been noted above, the threshold voltage of flash memory cells may be unintentionally changed by one or more factors during conventional programming operations. However, flash memory devices operated in accordance with embodiments of the inventive concept reduce or eliminate the possibility of unintentionally changing the threshold voltage of a memory cell during programming operation by the use of selective memory cell sequencing during the programming operation in conjunction with certain types of threshold voltage distributions.

Figure 1:
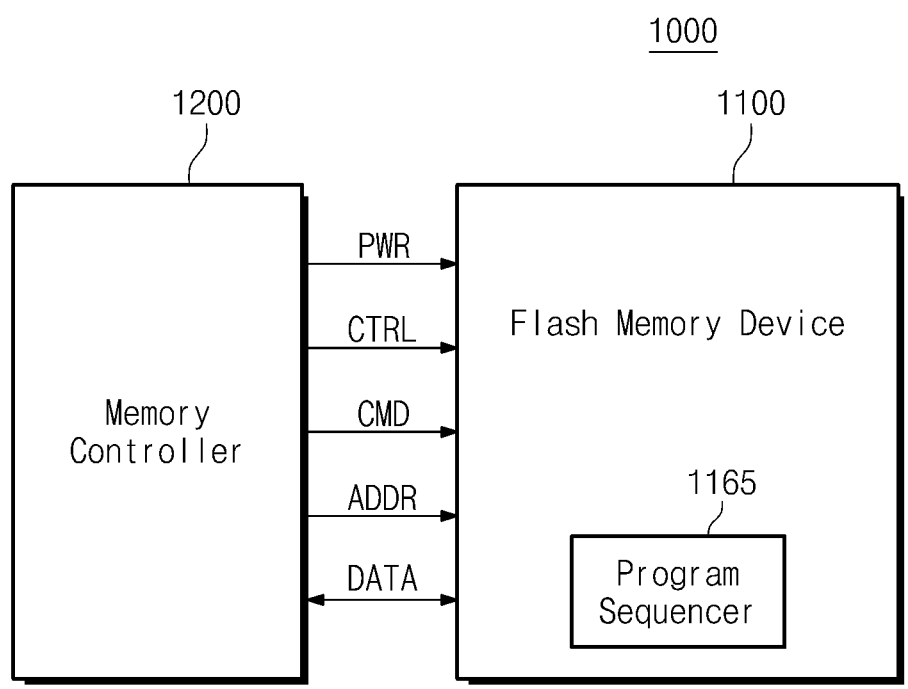
FIG. 1 is a general block diagram of a flash memory system according to an embodiment of the inventive concept.

Figure (FIG. 1 is a block diagram illustrating one possible example of a flash memory system according to an embodiment of the inventive concept.

Referring to FIG. 1, a flash memory system 1000 generally comprises a flash memory device 1100 and a memory controller 1200. The flash memory system may be implemented in a variety of forms specifically adapted for different uses, such as a memory card, a Universal Serial Bus (USB) memory, a solid state disk (SSD), etc.

The flash memory device 1100 is configured to perform erase operations, program operations, and read operations under the control of the memory controller 1200. In this regard, the flash memory device 1100 receives a command (CMD), one or more corresponding address(es) (ADDR), and data (DATA) via conventionally configured input/output (I/O) lines. During a program operation, a program command may include "write data" to be programmed to the memory cell array of the flash memory device 1100. In contrast during a read operation, the flash memory device 1100 will return "read data" retrieved from the memory cell array in response to a read operation command.

Moreover, the flash memory device 1100 also receives a power source (PWR) via power source line(s), as well as various control signals (CTRL) via control line(s). As is conventionally understood, the commands, control signals and data exchanged between the memory controller 1200 and the flash memory device 1100 may be configured according to various protocol(s), standards, and design constraints and objectives. Examples of control signals (CTRL) that might be used in the embodiment of FIG. 1 include; a command latch enable signal CLE, an address latch enable signal ALE, a chip enable signal nCE, a writing enable signal nWE, a read enable signal nRE, etc.

Certain embodiments of the inventive concept place a program sequencer 1165 within the circuitry and software forming the flash memory device 1100. In operative effect, the program sequencer 1165 defines a programming sequence for a plurality of memory cells arranged in the memory cell array of the flash memory device 1100. Those skilled in the art will understand that the program sequencer 1165 may be variously implemented using software, firmware, and/or hardware.

Alternately, instead of being placed in the flash memory device 1100, the program sequencer 1165 may be placed within the circuitry and/or software forming the memory controller 1200, or in a separate integrated circuit external to both the flash memory device 1100 and memory controller 1200. (See, e.g., the more specific embodiment described hereafter in relation to FIG. 24). Wherever physically placed, the program sequencer 1165 may in certain embodiments of the inventive concept be associated with and/or managed by a Flash Transition Layer (FTL). Those skilled in the art understand that a FTL is hardware/software capable of translating between logical addresses associated with read/write data communicated to/from the memory controller 1200 and physical addresses associated with the flash memory cells of the flash memory device 1100.

Figure 2:
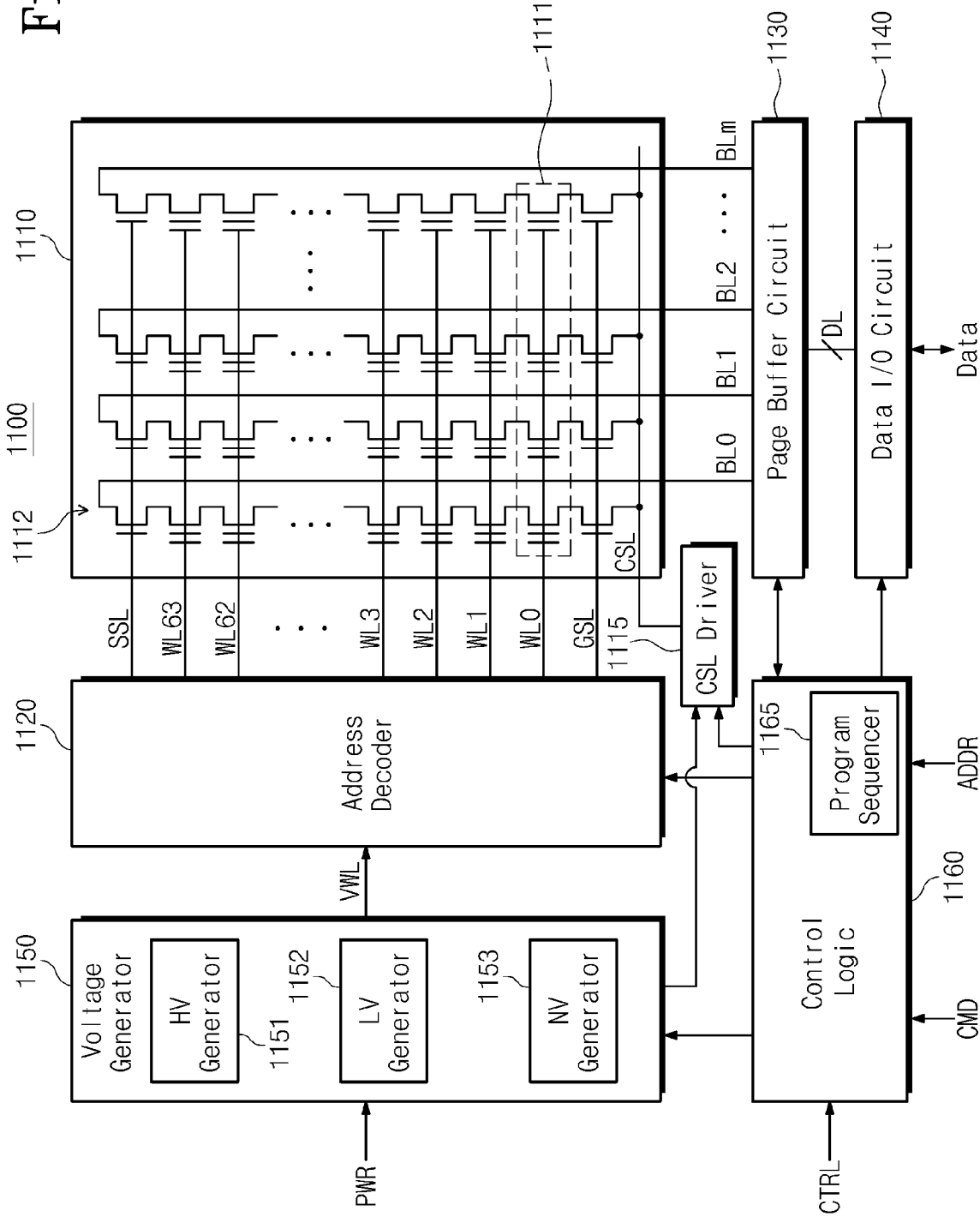
FIG. 2 is a block diagram further illustrating the flash memory device of FIG. 1.

FIG. 2 is a block diagram further illustrating one possible embodiment for the flash memory device 1100 of FIG. 1.

Referring to FIG. 2, the flash memory device 1100 comprises in relevant portion a memory cell array 1110, an address decoder 1120, a page buffer circuit 1130, a data input/output (I/O) circuit 1140, a voltage generator 1150, and a control logic 1160.

The memory cell arranged in the memory cell array 1110 may be configured into a plurality of memory blocks. However, only a single memory block is illustrated in FIG. 2 to avoid unnecessary complexity. As is conventionally understood, each memory block may be configured according to a plurality of "physical pages". In the illustrated embodiments that follow, a physical page is defined as a plurality of memory cells commonly connected to one of a plurality of "N" word line (WL). The embodiment illustrated in FIG. 2 assumes that N is equal 64 and that word lines (WLs) are disposed in a consecutive arrangement order ranging (without skip) from WL0 to WL63 (or N−1). Element 1111 of FIG. 2 indicates one (1) physical page connected to a first word line WL0, as one possible example.

Embodiments of the inventive concept include various memory cell arrays comprising flash SLCs and/or MLCs. For embodiments of the inventive concept incorporating N-bit flash MLCs, each physical page may be configured to include N logical pages, where a logical page is defined as a plurality of memory cells associated with a single physical page and simultaneously programmed during a program operation.

The memory cell array 1110 of FIG. 2 comprises a plurality of memory cell strings. Each cell string (e.g., element 1112) comprises a plurality of memory cells respectively connected to one of a plurality of word lines WL0 to WL63 and arranged between a string selection transistor connected to a string selection line SSL, and a ground selection transistor connected to a ground selection line GSL. Each string selection transistor is respectively connected to a corresponding bit line BL, and each ground selection transistor is connected to a common source line CSL.

A CSL driver 1115 may provide ground voltage or some other CSL voltage (e.g., VDD) to the common source line CSL. The CSL driver 1115 is controlled by the control logic 1160 and may receive power from the voltage generator 1150.

As illustrated in FIG. 2, the address decoder 1120 is connected to the memory cell array 1110 through the selection lines SSL and GSL or the word lines WL0 to WL63. During various operations, the address decoder 1120 may select one or more of the plurality of word lines WL0 to WL63 in accordance with the received address ADDR.

The page buffer circuit 1130 is connected to the memory cell array 1110 through a plurality of bit lines BL0 to BLm, and may be configured with a plurality of page buffers (not shown). As is conventionally appreciated, one or more bit line(s) may be connected to a page buffer according to a defined architecture (e.g., an all BL structure, a shield BL structure, etc.). The page buffer circuit 1130 may be used to temporarily store write data to be programmed to the memory cell array 1110 or read data retrieved from the memory cell array (e.g., a selected physical page, such as 1111).

The data I/O circuit 1140 is internally connected to the page buffer circuit 1130 through a data lines (DL), and externally connected to the memory controller 1200 through an I/O lines, per FIG. 1. The data I/O circuit 1140 may be configured to receive write data from the memory controller 1200 during a program operation, or provide a read data to the memory controller 1200 during a read operation.

The voltage generator 1150 receives an externally provided power voltage PWR (e.g., from the memory controller 1200) and generates various control voltages applied to the memory cell array 1110 during operations. For example, during read, program and erase operations certain word line voltages (VWL) will be generated by the voltage generator 1150 and applied to one or more selected word lines via the address decoder 1120. Within the embodiment illustrated in FIG. 2, the voltage generator 1150 includes a high voltage generator 1151, a low voltage generator 1152, and a negative voltage generator 1153, but different voltage generation arrangements may be provided.

The high voltage generator 1151 may be used to generate certain High Voltages (HV) having a voltage level greater than the power source voltage PWR. Examples of high voltages include a programming voltage (Vpgm) and a pass voltage (Vpass), as are conventionally understood. The low voltage generator 1152 may be used to generate certain Low Voltages (LV) equal to or less than the power source voltage PWR. Examples of low voltages include the power source voltage and voltages used as a bit line precharge voltage or a CSL voltage. The negative voltage generator 1153 may be used to generate certain Negative Voltages (NV) having a voltage level less than 0V. Examples of negative voltages include certain program verification voltages and read voltages.

The control logic 1160 is generally configured to control the program, read and erase operations (along with other types of operations) performed by the flash memory device 1100 in response to the received address ADDR and control signals CTRL. During program operations, for example, the control logic 1160 may cause the address decoder 1120 to provide a programming voltage to a selected word line WL0 in response to the address ADDR. In response to the applied programming voltage, program data will be provided from a selected page 1111 corresponding to the selected word line WL0 by control of the page buffer circuit 1130 and data I/O circuit 1140.

In the illustrated embodiment of FIG. 1, the control logic 1160 includes a program sequencer 1165. As will be explained in some additional detail hereafter, the program sequencer 1165 may define a particular programming sequence for memory cells as a function of physical page and/or logical page.

FIG. 3 is a threshold voltage distribution diagram illustrating programming step changes to a threshold voltage of a 2-bit flash MLC, such as the type that may be incorporated into the memory cell array 1110 of FIG. 2. The exemplary 2-bit flash memory cell of FIG. 3 may be programmed into one of four (4) data states E0, P1, P2, and P3 in accordance with corresponding threshold voltage distributions. The complete programming of the memory cell from an initial erase state E0 requires two sequential programming operations (or steps), a Least Significant Bit (LSB) programming operation followed by a Most Significant Bit (MSB) programming operation.

From the initial erase state E0, the LSB programming operation will program a least significant bit by either retaining the memory cell state at the erase state E0, or programming the memory cell to an intermediate state P0. Next, the MSB programming operation will program the corresponding most significant bit by either retaining the memory state at the erase state E0, programming the erase state to a first program state P1, and programming the intermediate state P0 to a second program state P2 or programming the intermediate state to a third programming state P3.

As ideally illustrated in FIG. 3, the four (4) possible data states E0, P1, P2 and P3 for the memory cell are respectively separated by sufficient read margins (RM). Unfortunately, as these read margins become impaired by changes to the ideal threshold voltage distributions due to (e.g.,) coupling noise, pass voltage (Vpass) disturbances, and programming voltage (Vpgm) disturbances, read operations suffer.

For example, coupling noise may unintentionally change the threshold voltage of a memory cell in an adjacent (or neighboring) page during a program operation directed to a target page. During a Vpass disturbance the threshold voltage of a memory cell in an unselected page is unintentionally increased in response to a pass voltage applied to an unselected word line during a program operation. During a Vpgm disturbance the threshold voltage of a program-inhibit cell in a selected page is unintentionally changed when a programming voltage Vpgm is applied to a selected word line during a program operation.

Regardless of the specific cause of the unintentional change to a threshold voltage of a memory cell, a read operation failure may occur in the operation of the flash memory device 1100 due to insufficient or impaired read margin. Referring again to FIG. 2, the flash memory device 1100 designed and operated according to an embodiment of the inventive concept may reduce or minimize the possibility of this type of read operation failure by appropriate use of the program sequencer 1165 and careful definition of the threshold voltage distributions defining the data states of a MLC. Hereinafter, various exemplary program sequences will be described that will reduce the possibility of unintentional changes to the threshold voltage of a flash memory cell during a program operation.

FIG. 4, inclusive of FIGS. 4A and 4B, illustrates one possible program sequence for the memory cells of the flash memory device 1110 of FIG. 2.

Consistent with the working example of FIG. 2, the flash memory device 1100 is assumed to include sixty-four (64) physical pages, wherein each physical page includes two (2) logical pages—an LSB page and a MSB page—for a total of one hundred and twenty-eight (128) logical pages programmed by application of control voltages to sixty-four (64) word lines respectively corresponding to the physical pages. Thus, N word lines correspond to N physical pages divided in 2N logical pages.

The program sequence shown in FIG. 4A includes a LSB programming operation wherein each one of the plurality of the LSB pages (1-64) are sequentially programmed from a lowest page (1) to a highest page (64), and a MSB programming operation wherein each one of the plurality of LSB pages (65-128) are sequentially programmed from a lowest page (65) to a highest page (128). In this context, the term "sequential" means a word line by adjacent word line transition in a program sequence. That is, after numbering N word lines from 0 to N−1 in ascending or descending physical order over memory cell array 1110, a sequential program will cause control voltages to be applied by the control logic 1160, voltage generator 1150, and row decoder 1120 to the plurality of word lines in said order without skipping any number in the order. The term "non-sequential" denotes any other type of order control voltage application to the N word lines.

Accordingly, the program sequence illustrated in FIG. 4, causes all the LSB pages (1-64) to be sequentially programmed, and then all of the MSB pages (65-128) to be sequentially programmed.

Thus, in an example illustrated by FIG. 4, the sixty-second word line (WL62) corresponding to the $62^{nd}$ physical page receives the control voltage Vpass (and corresponding stress) sixty two times before the 63rd logical page is actually programmed during the LSB programming operation. Thus, after being LSB programmed, the $62^{nd}$ physical page experiences only one (1) possible coupling noise effect during MSB programming. Accordingly, the fully sequential program sequence illustrated in FIG. 4 minimizes the possibility of unintentionally changing the threshold voltage of memory cells connected to WL63 due to coupling noise and the Vpass stress. The possible influence of these effects on the working example described above is illustrated in FIG. 4B, wherein read margin is reduced by the combined influence of coupling noise and the Vpass stress.

By way of further illustration, FIG. 5, inclusive of FIGS. 5A and 5B, FIG. 6, inclusive of FIGS. 6A and 6B, and FIG. 7, inclusive of FIGS. 7A and 7B, show exemplary memory cell string diagrams associated with different control voltage applications and assuming different threshold voltage distributions. These further examples of related program sequences illustrate programming methods that decrease the potential influence of the Vpgm disturbance, as compared with the program sequence of FIG. 4. In FIGS. 5, 6 and 7, it is assumed that a selected memory cell M1 is a program-inhibit cell is located in the 66th logical page of FIG. 4 connected to the second word line WL1 during a MSB programming operation.

During a bit line setup period, ground voltage 0V is applied to a program bit line BL, and a power source voltage VDD is applied to a program-inhibit bit line BL. During a program operation execution period, when a programming voltage Vpgm is applied to the selected second word line WL1, a program cell is programmed by F-N tunneling, but the programming of the program-inhibit cell is inhibited by channel boosting. Hence, a Vpgm disturbance may occur when channel boosting is insufficient to effectively program-inhibit the memory cell M1.

Referring to FIG. 5, the threshold voltage of memory cell M1 is negative (less than 0V) in the erase state E0, but is positive (greater than 0V) in the intermediate program state P0 following the LSB programming operation. Thus, during the bit line setup period of the MSB programming operation (hereinafter, the MSB BL setup period), a word line voltage VWL of 0V is applied to all of the word lines, and the power source voltage VDD is applied to a program-inhibit bit line BLi. According to an example illustrated in FIG. 5, memory cells M2 through M63 will form or break channels according to their respective LSB programming states (either the erase state E0 or the intermediate program state P0). When any one of the memory cells M2 through M63 is programmed to the intermediate program state P0, the power source voltage may not sufficiently be provided to the memory cell M1 to ensure programming inhibition. In such a case, the memory cell M1 may not be channel-boosted during the following MSB programming operation. As a result, the threshold voltage of the memory cell M1 may be erroneously programmed.

To prevent the foregoing Vpgm disturbance, the flash memory device 1100 of FIG. 2 may provide a word line voltage VWL that is greater than the threshold voltage distribution of the intermediate state P0 during the MSB BL setup period. There are various approaches that may be used to accomplish this outcome.

Referring to FIG. 6, as an example, the flash memory device 1100 may apply a word line voltage (e.g., VDD) greater than the threshold voltage distribution of the intermediate state P0 during the MSB BL setup period. When the word line voltage VWL is greater than the threshold voltage distribution of the intermediate state P0, the memory cells M2 through M63 may form channels irrespective of their LSB programming state. During the MSB BL setup period, that is, although any one of the memory cells M2 through M63 may be programmed to the intermediate program state which is positive, the memory cell M1 may nonetheless receive a sufficiently high voltage (e.g., VDD) to be properly program-inhibited.

Referring to FIG. 7, as another example, the flash memory device 1100 may define the threshold voltage distribution for the intermediate state P0 to be negative (i.e., be wholly or partially less than 0V). When the intermediate state P0 is negative, the memory cells M2 through M63 may form channels irrespective of their LSB programming state. In certain embodiments of the inventive concept, a threshold voltage distribution (intermediate program state or otherwise) is "negative" if it is discriminated from a next lower threshold voltage distribution by a negative verification voltage (e.g., the intermediate verification voltage VFY0 of FIG. 7). During the MSB BL setup period, that is, although a word line voltage VWL of 0V is applied, the memory cell M1 will receive sufficient voltage to be properly program-inhibited, thereby avoiding the Vpgm disturbance. There are various approaches to the definition of a negative intermediate program state P0 within the operation of the flash memory device 1100 of FIG. 2, as will be described hereafter.

Figure 8A:
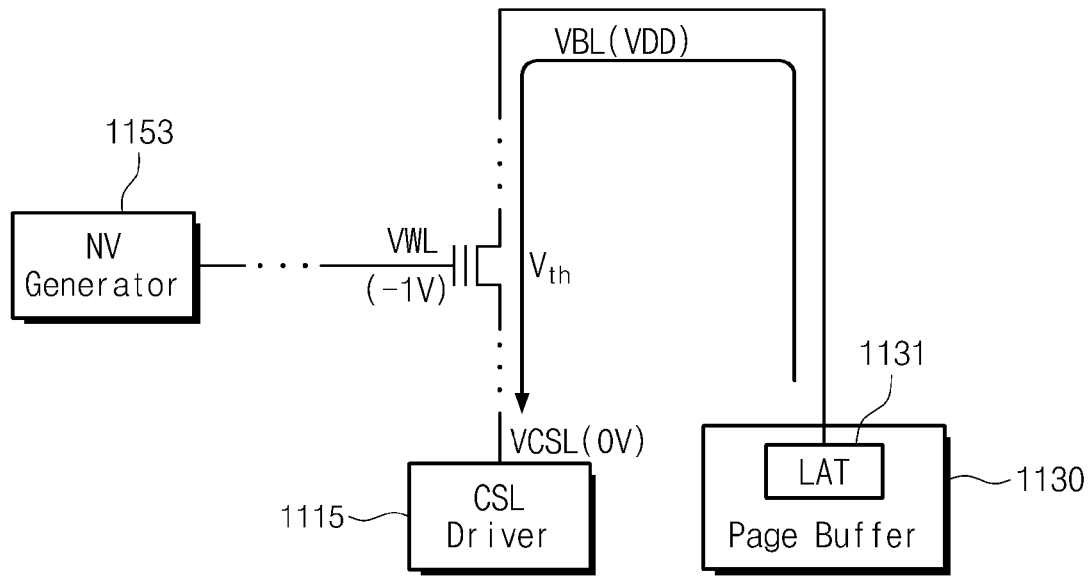
FIG. 8, inclusive of FIGS. 8A and 8B, illustrates one possible approach to defining a negative intermediate program state P0.
Figure 8B:
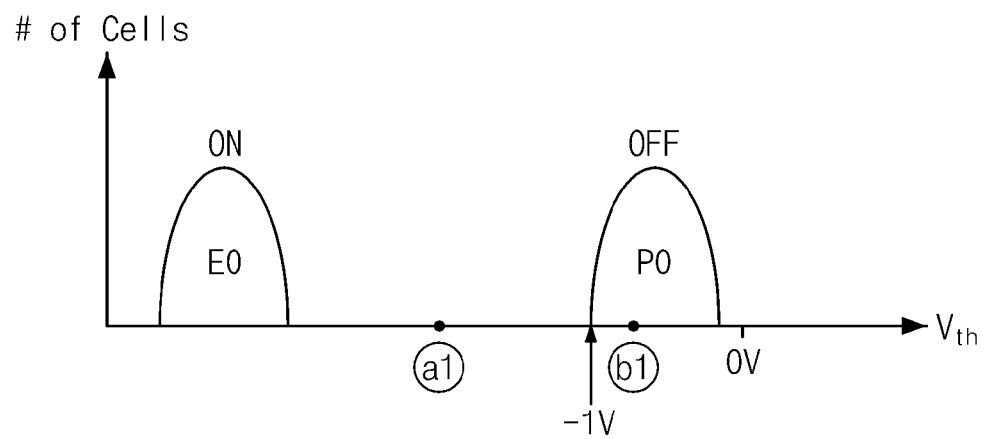
Figure 9A:
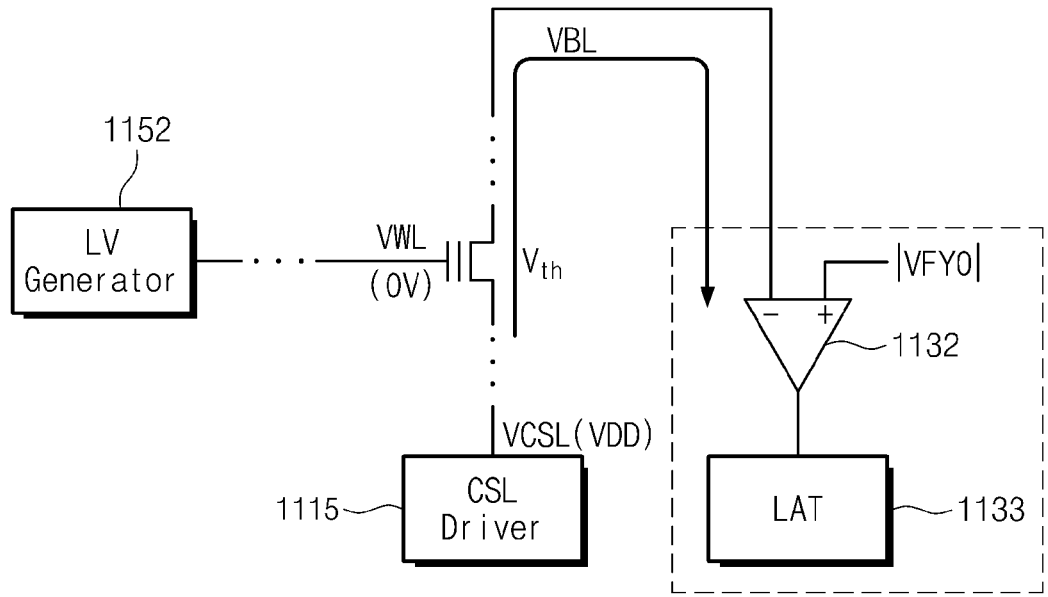
FIG. 9, inclusive of FIGS. 9A and 9B, illustrates another possible approach to defining a negative intermediate program state P0.
Figure 9B:
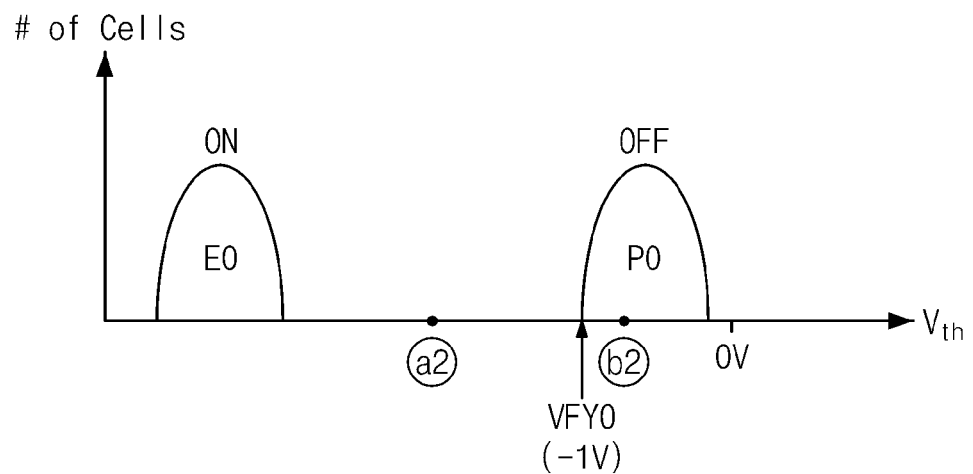
Figure 10A:
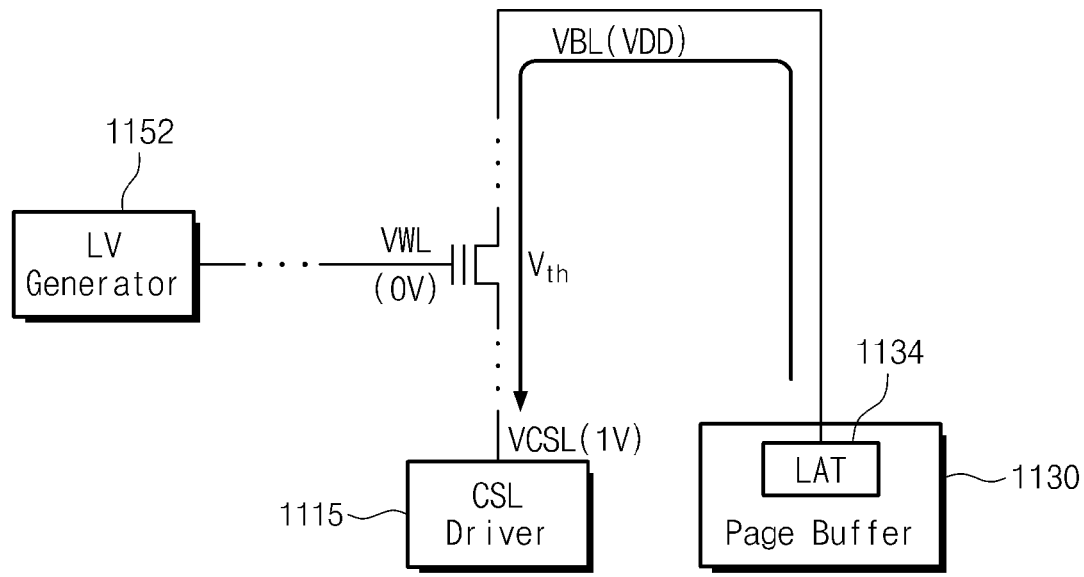
FIG. 10, inclusive of FIGS. 10A and 10B, illustrates yet another possible approach to defining a negative intermediate program state P0.
Figure 10B:
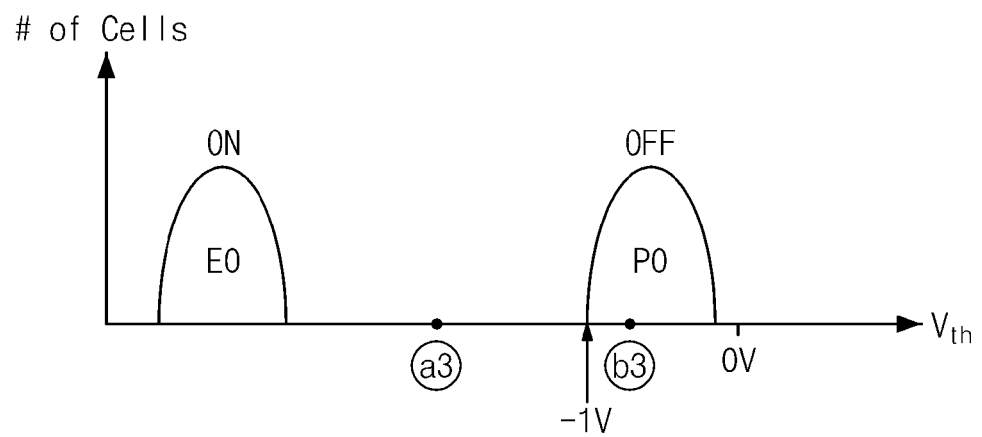

By way of further illustration, FIG. 8, inclusive of FIGS. 8A and 8B, FIG. 9, inclusive of FIGS. 9A and 9B, and FIG. 10, inclusive of FIGS. 10A and 10B, show several approaches to the definition of a negative intermediate program state P0. During an LSB programming operation, the threshold voltage distribution of each memory cell may be determined according to a program verification bias condition.

Herein, as a program verification bias voltage, a voltage VWL is applied to the selected word line, a voltage VBL is applied to the corresponding bit line for the selected memory cell, and a voltage VCSL is applied to the common source line CSL. Although not shown in FIGS. 8 to 10, a voltage sufficient to turn ON a memory cell or a selected transistor is applied to unselected word lines and/or selection lines (SSL and GSL). With reference to FIG. 2 and FIGS. 8 to 10, the selected word line voltage VWL is generated by the voltage generator 1150 and provided through the address decoder 1120, the voltage VBL is provided through the page buffer circuit 1130, and the voltage VCSL is applied through the CSL driver 1115.

FIG. 8 illustrates an example wherein a negative voltage generator, such as the negative voltage generator 1153, is used.

Referring to FIG. 8, the flash memory device 1100 provides a negative program verification voltage (e.g., VWL=−1V) to the selected word line during the LSB programming operation and more particularly during a LSB program verification operation. The flash memory device 1100 may generate the negative program verification voltage using the negative voltage generator 1153, and applied to the selected word line, while the power source voltage VDD is applied to the selected bit line, and 0V is provided to the common source line.

Under these voltage bias conditions, when it is assumed that the threshold voltage (Vth) of a memory cell is "a1", the memory cell operates as an ON memory cell because (VWL-VCSL) is greater than the threshold voltage Vth. Accordingly, a charge apparent on the bit line is discharged to the common source line through the ON memory cell. As a result, a latch circuit 1131 (LAT, assumed to be part of the page buffer circuit 1130) will latch program continuance data (e.g., a data value of 0). In this context, the term "program continuance data" denotes a data value requiring iterative (or continuing) performance of a programming operation on a selected memory cell.

However, when the threshold voltage (Vth) of a memory cell rises to "b1", the memory cell operates as an OFF memory cell because the (VWL-VCSL) is less than or equal to the threshold voltage Vth. Accordingly, the charge apparent on the bit line is retained. As a result, the latch circuit 1131 (LAT) will latch program terminating data (e.g., a data value of 1). In this context, the term "program terminating data" denotes a data value terminating the programming operation on the selected memory cell. Thus, FIG. 8 illustrates one approach to the negative defining of an intermediate program state P0.

FIGS. 9 and 10 illustrate further examples wherein the CSL driver 1115 may be used to define a negative intermediate program state P0.

Referring to FIG. 9, the flash memory device 1100 applied the power source voltage VDD to the common source line CSL during the LSB program verification operation. The flash memory device 1100 may generate the power source voltage using the low voltage generator 1152. Ground voltage 0V is applied to the selected word line.

Under these bias conditions, when it is assumed that the threshold voltage (Vth) of a memory cell is "a2", the memory cell is turned OFF in a case where the bit line voltage VBL becomes (VWL-Vth), or the bit line voltage VBL is (VWL-Vth), i.e., may increase to an absolute value |a2| of a2. At this point, the page buffer circuit 1130 compares the voltage VBL and |VFY0| with a comparator 1132. Herein, the voltage VFY0 may also be termed a program target voltage. Since the voltage VBL is greater than |VFY0| as a comparison result, the latch circuit 1131 (LAT) latches the program continuance data.

If the threshold voltage of a memory cell rise to "b2", the latch circuit 1131 (LAT) latches the program terminating data because the voltage is less than or equal to |VFY0|. Thus, FIG. 9 illustrates another approach whereby the intermediate program state P0 may be made negative.

Referring to FIG. 10, the flash memory device 1100 applies a CSL voltage (e.g., VCSL=1V) to the common source line during the LSB program verification operation. Ground voltage 0V is applied to the selected word line, and the power source voltage VDD is applied to the selected bit line. Herein, the voltage VCSL is less than the voltage VDD and may be equal to the absolute value of a program target voltage VFY0.

Under these bias conditions, when it is assumed that the threshold voltage (Vth) of the memory cell is "a3", the memory cell operates as an ON cell because (VWL-VCSL) is greater than the threshold voltage Vth. Accordingly, the latch circuit 1131 (LAT) latches the program continuance data.

However, when the threshold voltage of a memory cell rise to "b3", the memory cell operates as an OFF cell because (VWL-VCSL) is less than or equal to the threshold voltage Vth. Accordingly, the latch circuit 1131 (LAT) latches the program terminating data. Thus, FIG. 10 illustrates yet another approach whereby the intermediate program state P0 may be made negative.

Referring again to FIG. 7, the flash memory device 1100 may set the intermediate program state P0 to be negative and apply a word line voltage (e.g., 1V) greater than 0V during the MSB BL setup period. This approach may be desirable because the threshold voltage of certain memory cells programmed to the intermediate program state P0 may become greater than 0V even when applying a negative program verification voltage VFY0 during the LSB programming operation.

According to the above-described programming method, the possibility of a Vpgm disturbance occurring is reduced. Moreover, the level of the Vpass voltage and the Vread voltage may be reduced during the LSB programming operation. In this regard, the Vread voltage is the control voltage applied to unselected word line(s) during the LSB program verifying operation or a LSB read operation. The flash memory device 1100 of FIG. 2 may be configured to apply different Vpass voltage(s) and/or Vread voltage(s) during the LSB programming operation or MSB programming operation. That is, the flash memory device 1100 may apply a relatively lower Vpass voltage to a word line during the LSB programming operation, and a relatively lower Vread voltage to an unselected word line during the LSB program verifying operation.

Figure 11:
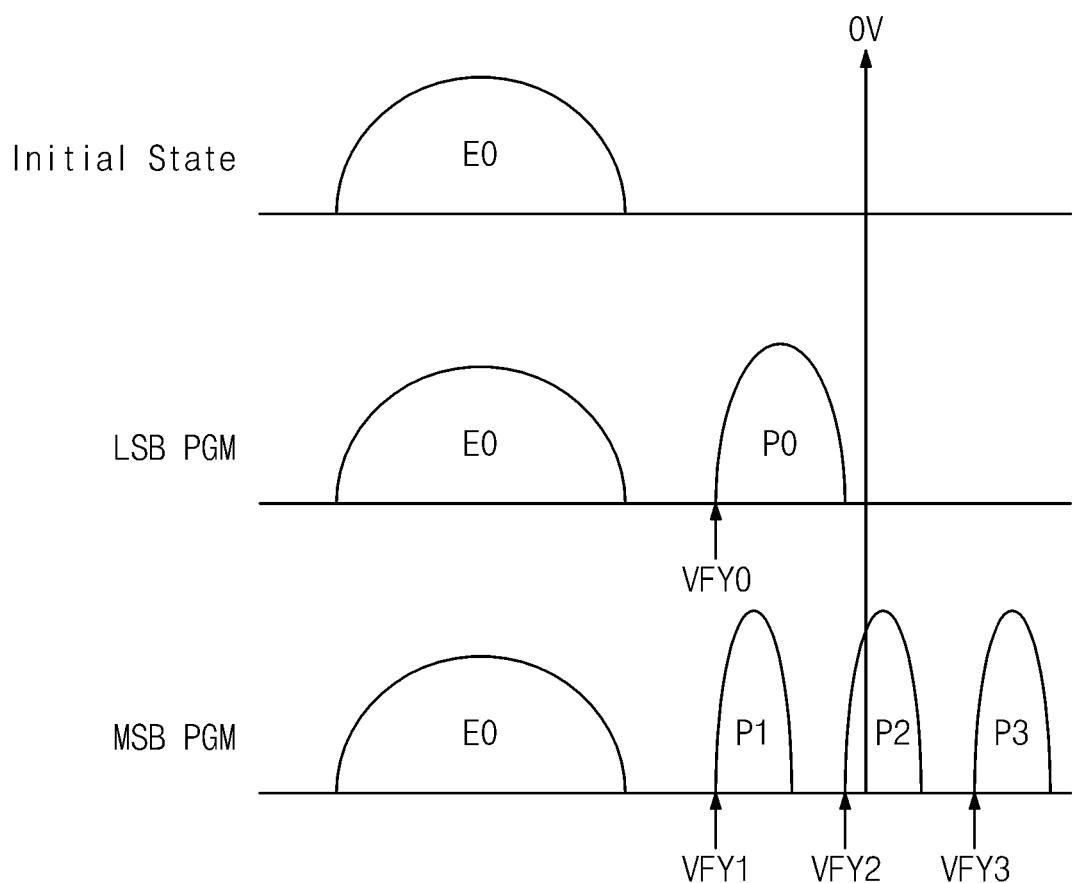
FIG. 11 is a threshold voltage distribution diagram illustrating another possible approach to the programming of an exemplary 2-bit flash memory cell.

FIG. 11 is a threshold voltage distribution diagram illustrating one possible method of operating a flash memory device using the program sequence illustrated in FIG. 4.

Referring to FIG. 11, an intermediate program verification voltage VFY0 for the intermediate program state P0 is negative and therefore the intermediate program state P0 is also negative during the LSB programming operation. During the MSB programming operation, a first program verification voltage VFY1 associated with the first program state P1 and a second program verification voltage VFY2 associated with the second program state P2 are also negative, but a third program verification voltage VFY3 associated with the third program state P3 is positive. Therefore, the first program state P1 and the second program state P2 are negative while the third program state P3 is positive under the definition established above.

Figure 12:
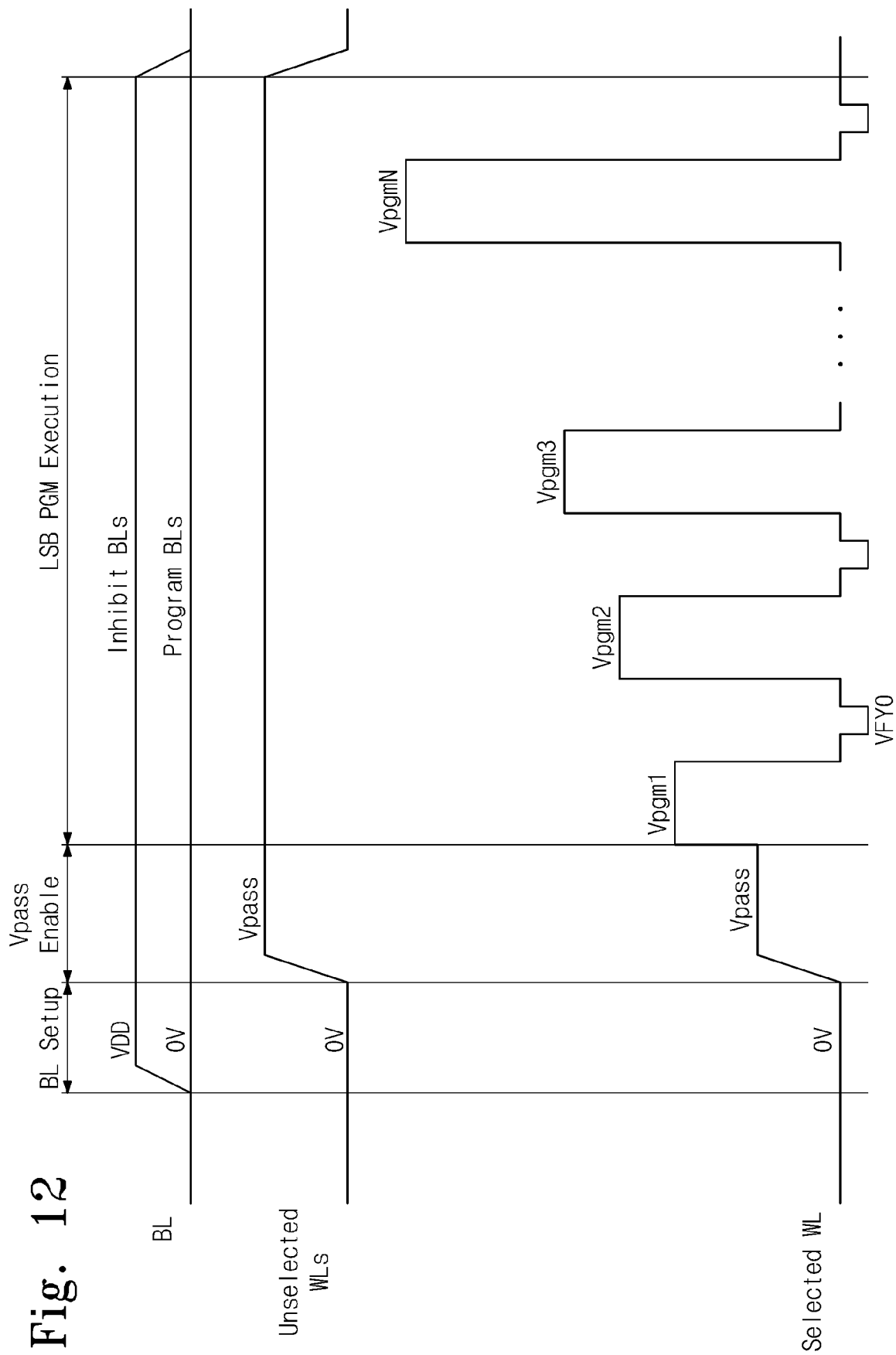
FIG. 12 is a timing diagram further illustrating a LSB programming operation compatible with the programming approach of FIG. 11.

FIG. 12 is a timing diagram further describing one approach to a LSB programming operation assuming the threshold voltage distributions definitions described in relation to FIG. 11.

Referring to FIG. 12, during an LSB BL setup period, the power source voltage VDD is applied to a program-inhibit bit line, 0V is applied to a program bit line, and 0V is applied to all word lines. Then, during a Vpass enable period, a Vpass voltage is applied to all the word lines. Finally, during an LSB program execution period, a conventionally understood Incremental Step Pulse Program (ISPP)-defined, programming voltage (Vpgm) is iteratively applied over programming loops 1 to N to the selected word line until the selected memory cell is properly programmed to the intermediate program state P0. Following each application of the ISPP-defined programming voltage Vpgm, a program verifying operation is performed using the negative intermediate program verification voltage VFY0.

Figure 13:
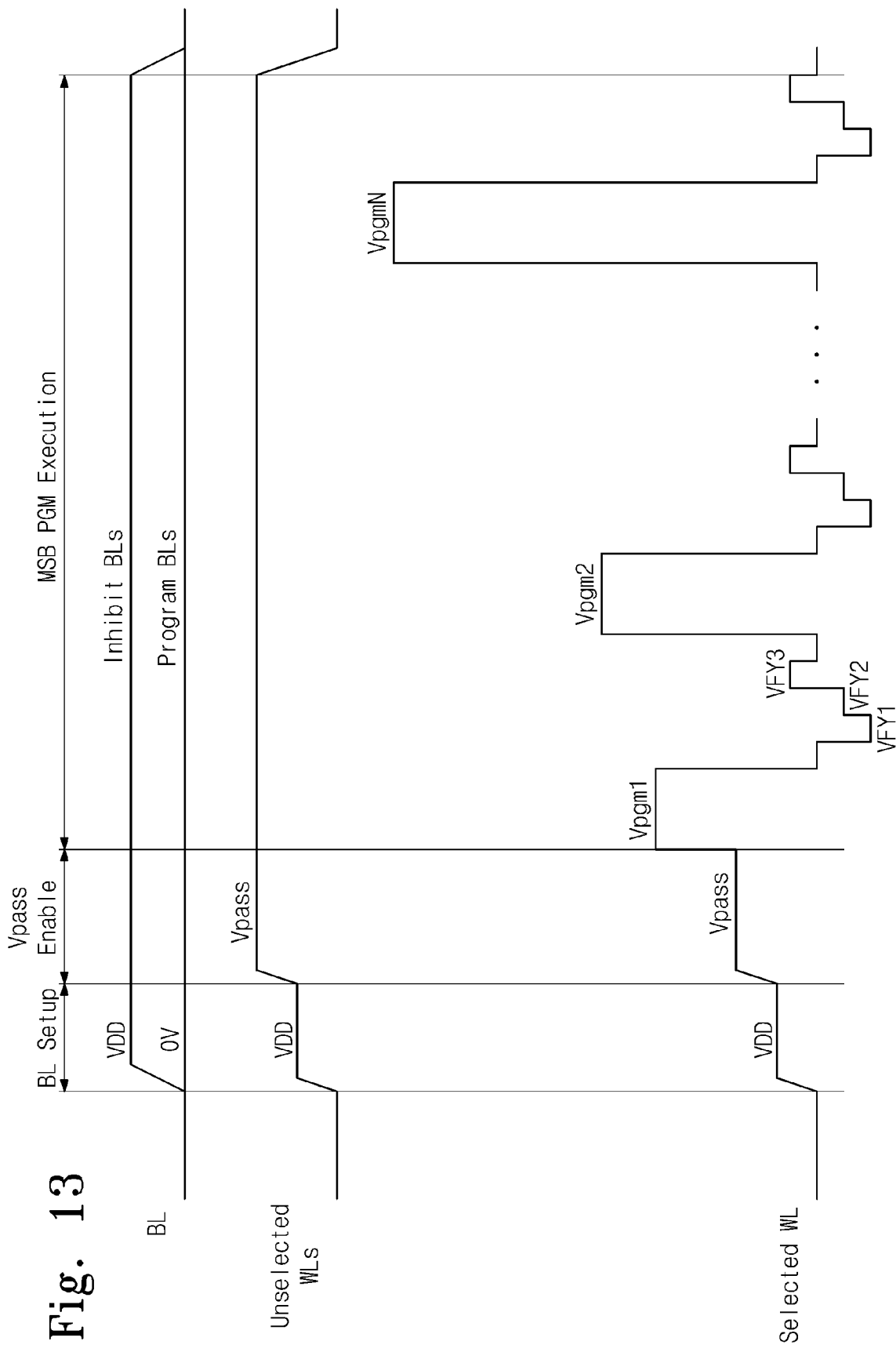
FIG. 13 is a timing diagram further illustrating a MSB programming operation compatible with the programming approach of FIG. 11.

FIG. 13 is a timing diagram further describing one approach to a MSB programming operation assuming the threshold voltage distributions definitions described in relation to FIG. 11.

Referring to FIG. 13, during an MSB BL setup period, the power source voltage VDD is applied to a program-inhibit bit line, 0V is applied to a program bit line, and a word line voltage (e.g., VDD) greater than the intermediate program state P0 is applied to all word lines. Then, during a Vpass enable period, a Vpass voltage is applied to all the word lines. Finally, during an MSB program execution period, an ISPP-defined programming voltage (Vpgm) is again iteratively applied. However, a three-step program verification operation is performed using first, second and third program verification voltages VFY1, VFY2 and VFY3. Of note in the illustrated embodiment of FIG. 13, the first and second program verification voltages VFY1 and VFY2 are negative, but the third program verification voltage VFY3 is positive.

Using, for example, the LSB and MSB programming operations described in relation to FIGS. 12 and 13, the flash memory device 1100 of FIG. 2—while using the fully sequential program sequence of FIG. 4—may nonetheless reduce the possibility of unintentional threshold voltage changes due to coupling noise, Vpass stress, and/or Vpgm disturbances. Additionally, the program sequence of FIG. 4 may be used while also reducing the level of Vpass voltage and Vread voltage.

Figure 14:
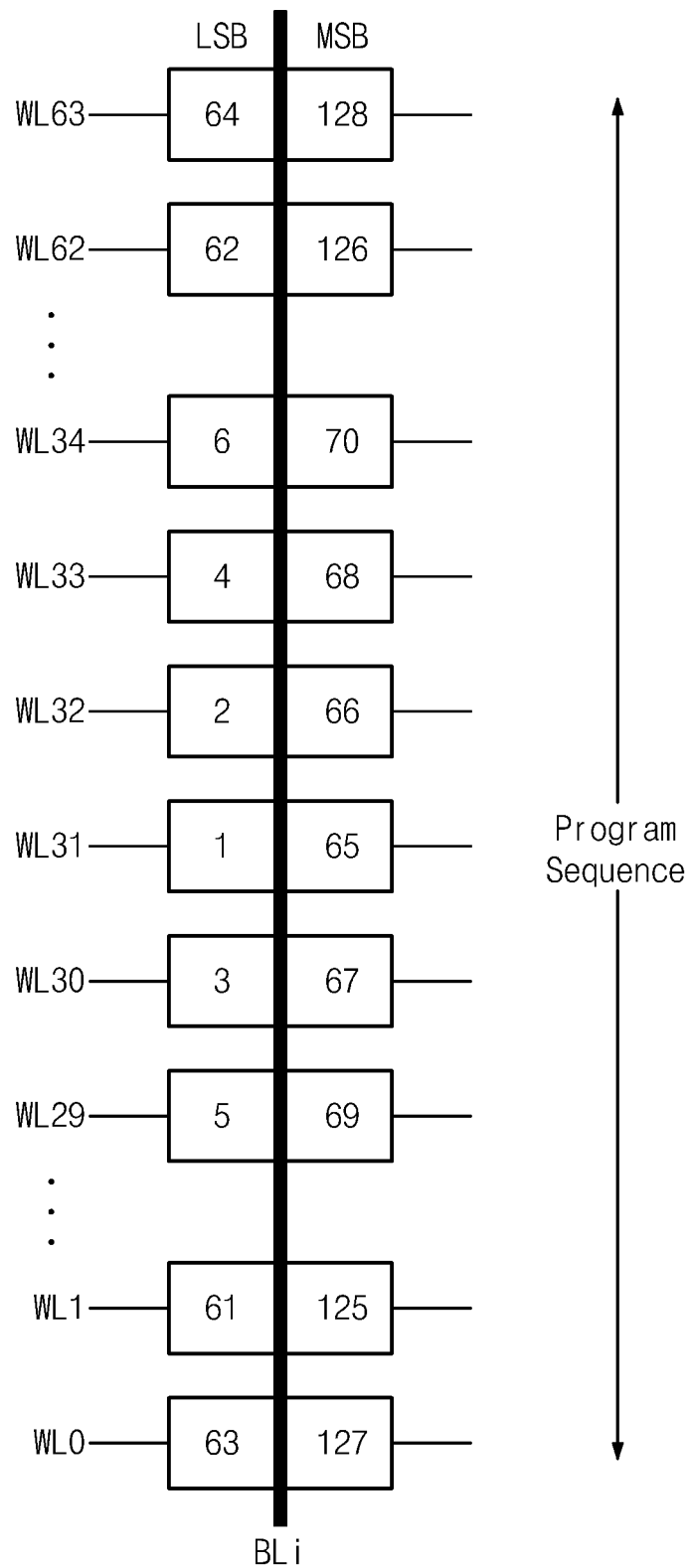
FIG. 14 illustrates another possible program sequence for the flash memory device of FIG. 2.

FIG. 14 illustrates another possible program sequence for the memory cells of the flash memory device 1110 of FIG. 2.

The same definition of 64 physical pages uniquely associated with 64 word lines (WL0 through WL63), and 128 logical pages is assumed for the example illustrated in FIG. 14. However, unlike the fully sequential program sequence described in relation to FIG. 4, the program sequence of FIG. 14 is non-sequential. That is, at least one of the LSB programming operation and the MSB programming operation applies defined control voltage(s) to an ordered arrangement of word lines in a non-sequential manner. Indeed, the program sequence of FIG. 14 is fully non-sequential in that neither the LSB programming operation nor the MSB programming operation programs any two adjacent word lines one after the other.

Instead, beginning with a "center word line" centrally disposed in the plurality of word lines (i.e., the N/2 word line, or e.g., WL31 in the illustrated embodiment of FIG. 14), the program sequence of FIG. 14 alternates the application of control voltages between "odd" and "even" defined word lines extending upward and downward from the center word line. In this context, those skilled in the art recognize that the terms upward and downward are used to denote word line in alternate sides of the center word line. Thus, a range of odd LSB pages (1-63, including a 1$^{st}$ LSB page associated with the center word line) and a range of even LSB pages (2-64) are defined in the example illustrated in FIG. 14. Then, the LSB programming operation provided by the embodiment of FIG. 14 proceeds in an odd/even alternating manner from the 1$^{st}$ odd LSB page, to the 1$^{st}$ even LSB page, and so on until all of the LSB pages have been programmed in an alternating (non-sequential) manner.

The same approach is taken to the programming of the MSB pages. A range of odd MSB pages (65-127), including a 1$^{st}$ MSB page associated with the center word line) and a range of even MSB pages (66-128) are defined. Then, the MSB programming operation provided by the embodiment of FIG. 14 proceeds in an odd/even alternating manner from the 1$^{st}$ odd MSB page, to the 1$^{st}$ even MSB page, and so on until all of the MSB pages have been programmed in an alternating (non-sequential) manner.

After the first program sequence step (i.e., from LSB page 1 to LSB page 2, or from MSB page 65 to MSB page 66) no two physical pages are ever programmed in program sequence described by the example of FIG. 14.

In the example of FIG. 14, the physical page associated with WL62 receives 61 iterations of Vpass stress before the 62nd logical page is LSB programmed. According to the program sequence of FIG. 14, moreover, the WL62 physical page experiences a one-time coupling noise effect due to the subsequent MSB programming operation.

Figures 15A, 15B:
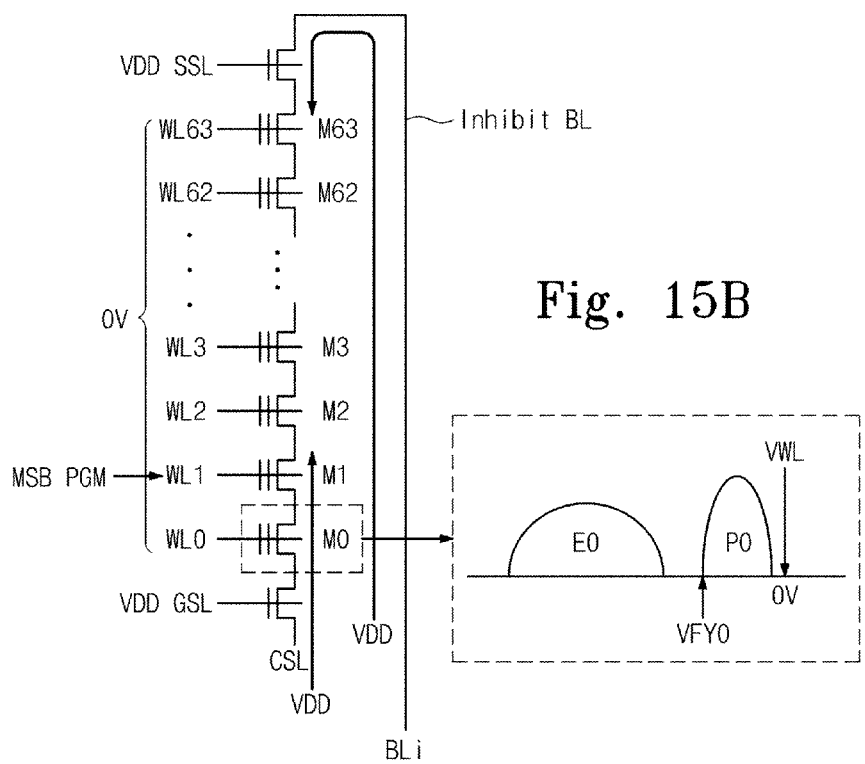
FIG. 15, inclusive of FIGS. 15A and 15B, illustrate another approach to operating the flash memory device of FIG. 2 according to the program sequence of FIG. 14 with a decreased probability of a Vpgm disturbance.
Figure 17A:
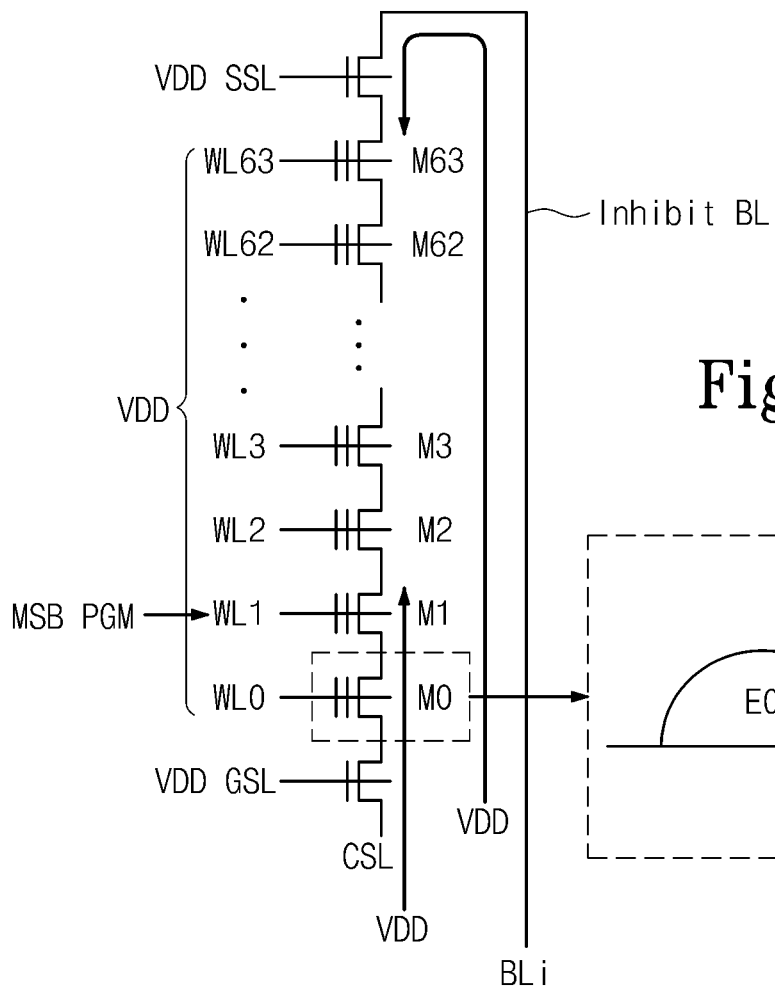
FIG. 17, inclusive of FIGS. 17A and 17B, illustrate another approach to operating the flash memory device of FIG. 2 according to the program sequence of FIG. 14 with a decreased probability of a Vpgm disturbance.
Figure 17B:
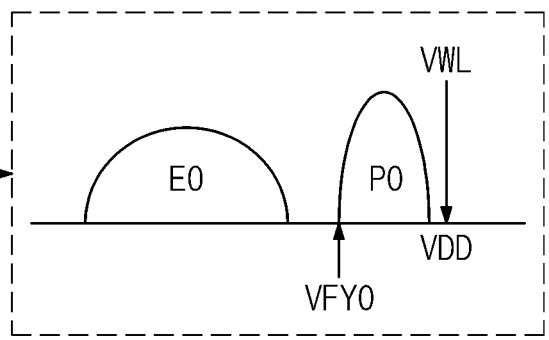
Figure 18:
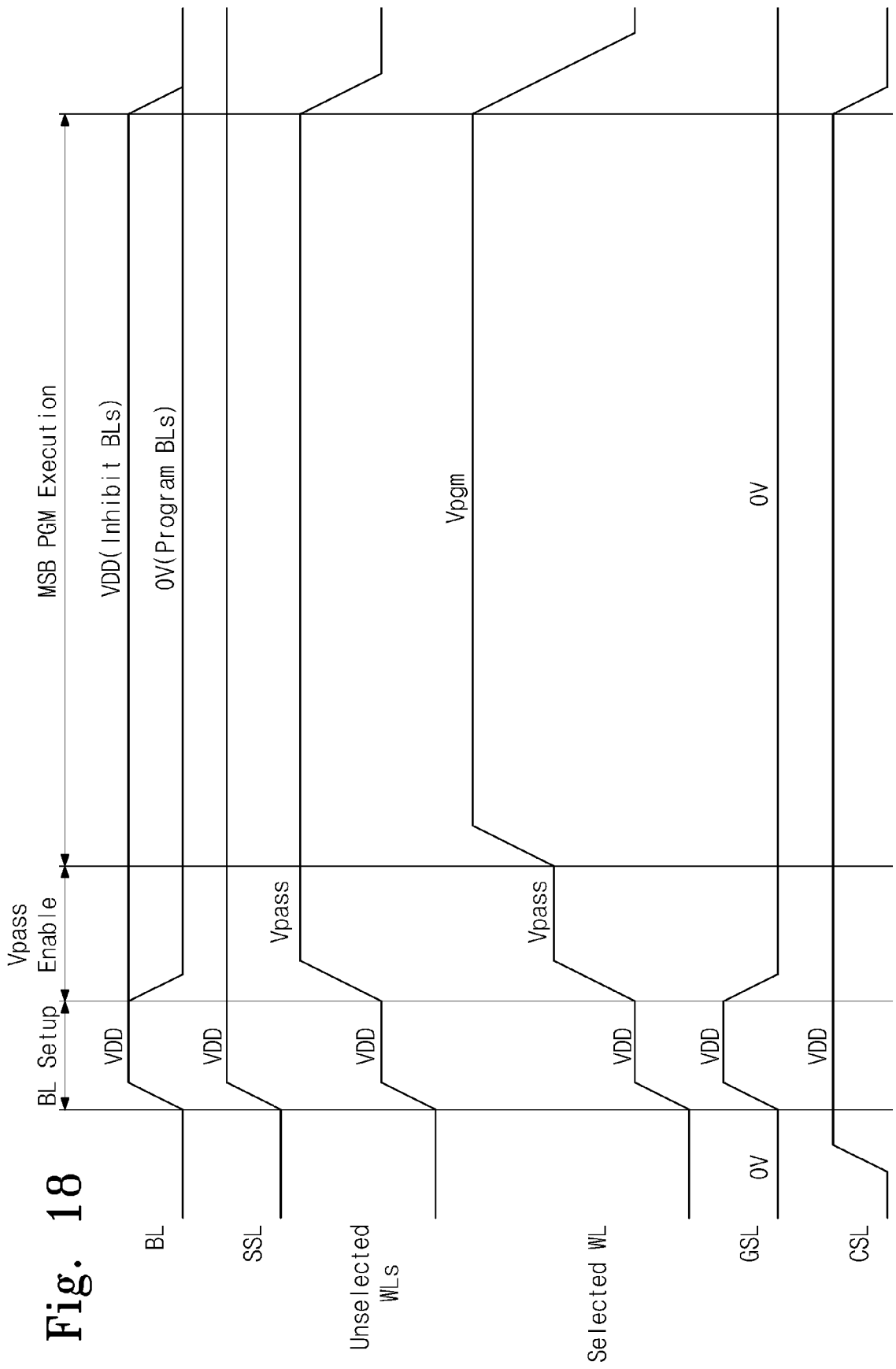
FIG. 18 is a timing diagram further illustrating a MSB programming operation compatible with the programming approach of FIGS. 14 and 17.

FIG. 15, inclusive of FIGS. 15A and 15B along with FIG. 16, and FIG. 17, inclusive of FIGS. 17A and 17B, along with FIG. 18 illustrate certain methods of operating the flash memory device 1110 of FIG. 2 that decreases the possibility of a Vpgm disturbance when it is assumed that the program sequence of FIG. 14 is used to program the constituent memory cell array. In order to decrease the likelihood of a Vpgm disturbance during the program sequence of FIG. 14, the flash memory device 1100 applies the power source voltage VDD from the CSL driver 1115 during the MSB BL setup period in order to provide a sufficiently high channel voltage to memory cells being programmed.

Referring to FIG. 15, it is again assumed that a memory cell M1 is a program-inhibit cell disposed in the 125th MSB page of FIG. 14 during a MSB programming operation directed to the physical page connected to the second word line WL1. During the MSB BL setup period, as illustrated in FIG. 16, the power source voltage VDD is applied to selection lines SSL and GSL, and the power source voltage VDD is applied to the common source line CSL. Ground voltage 0V is applied to all of the word lines WL0 to WL63.

Under these bias conditions, if the intermediate program state P0 of the LSB programming operation is negative, the adjacent memory cell M0 may form a channel regardless of its LSB programming state (e.g., E0 or P0). That is, even when a word line voltage VWL of 0V is applied during the MSB BL setup period, the adjacent memory cell M0 may be prevented from experiencing a Vpgm disturbance because it receives a sufficiently high voltage, i.e., power source voltage VDD from the CSL driver 1115.

Referring to FIG. 17, the flash memory device 1100 may apply a word line voltage (e.g., VDD) greater than the intermediate program state P0 during the MSB BL setup period. When the word line voltage VWL is greater than the intermediate program state P0, the adjacent memory cell M0 may form a channel regardless of its LSB programming state. That is, even when the adjacent memory cell M0 is programmed to the intermediate program state P0 greater than 0V during the MSB BL setup period, the selected memory cell M1 nonetheless receives a sufficiently high power source voltage. As illustrated in FIG. 18, during the MSB BL setup period, the flash memory device 1100 applies the power source voltage VDD to turn ON the ground selection line GSL, applies the power source voltage VDD to all word lines (selected or unselected) and provides the power source voltage VDD to a bit line.

According to the program sequence of FIG. 14, the coupling noise, the Vpass disturbance and the Vpgm disturbance can be reduced. According to the method of operating the nonvolatile memory device 1110 illustrated in FIG. 15, moreover, the Vpass voltage and the Vread voltage can be reduced during the LSB programming operation.

Figure 19:
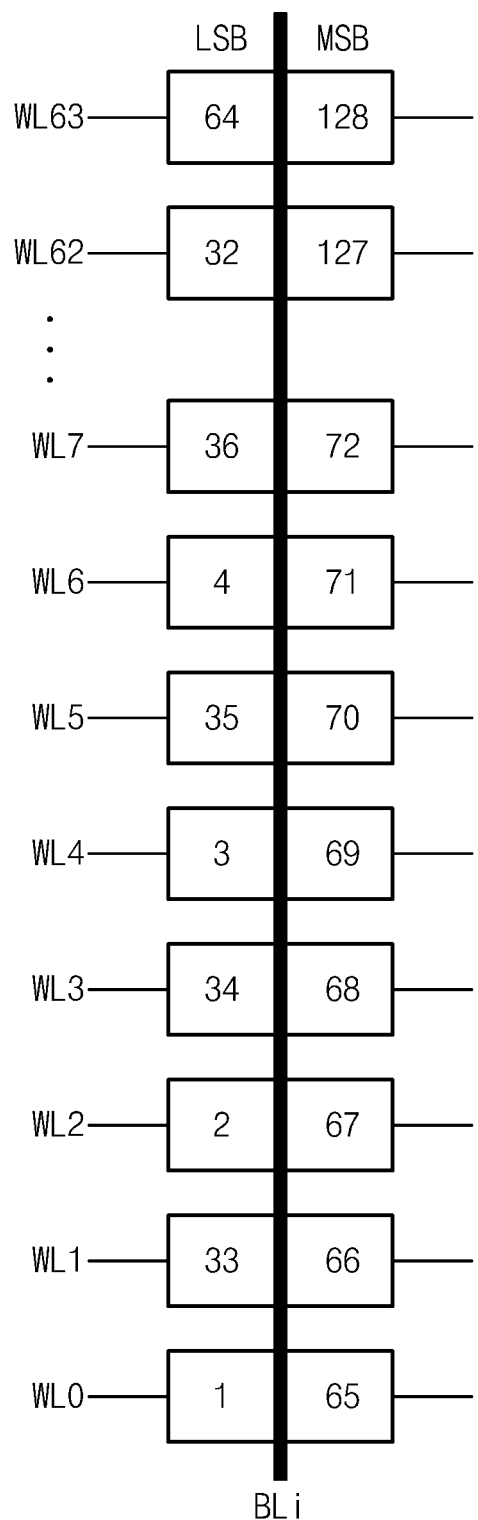
FIG. 19 illustrates another possible program sequence for the flash memory device of FIG. 2.

FIG. 19 illustrates another embodiment of a program sequence of the flash memory device in FIG. 2. Like the method described in relation to FIG. 4, the program sequence of FIG. 19 LSB-programs WL0 to WL63 physical pages, and then MSB-programs the WL0 to WL63 physical pages.

Unlike in the method of FIG. 4, the program sequence of FIG. 19 for the LSB and MSB programming first programs even-numbered word lines WL0, WL2, WL4, . . . , WL62, and then programs odd-numbered word lines WL1, WL3, WL5, . . . , WL63, where the even and odd word lines are ordered from a lowest word line WL0 to a highest word line WL63. In MSB programming, the program sequence of FIG. 19 performs programming identically to the program sequence of FIG. 4.

In the example of FIG. 19, a WL62 physical page receives 31 iterations of Vpass stress before the 32nd logical page is LSB-programmed. When the 32nd logical page is LSB-programmed in relation to the WL62 physical page, all of the physical pages receive a coupling noise at least one or more times. As the difference between the threshold voltage Vth and Vpass voltage of a memory cell becomes smaller, the memory cell receives relatively less Vpass stress. When the threshold voltage of a memory cell is increased by the coupling noise, the memory cell receives relatively less Vpass stress.

In FIG. 19, when LSB programming is performed for an even-numbered physical page, all the physical pages are in a state where the threshold of memory cells is increased by the coupling noise. Accordingly, the WL63 physical page receives 63 iterations of Vpass stress until being LSB programmed, but it receives relatively less Vpass stress as compared with the method described in relation to FIG. 4.

In addition to applying relatively less Vpass stress to the memory cells, the program sequence of FIG. 19 is able to decrease the possibility of a Vpgm disturbance, as compared with the approaches illustrated in FIGS. 6 and 7. The program sequence of FIG. 19 can therefore minimize the Vpass stress and thus can reduce the likelihood of unintentionally changing the threshold voltage of memory cells.

Figure 20:
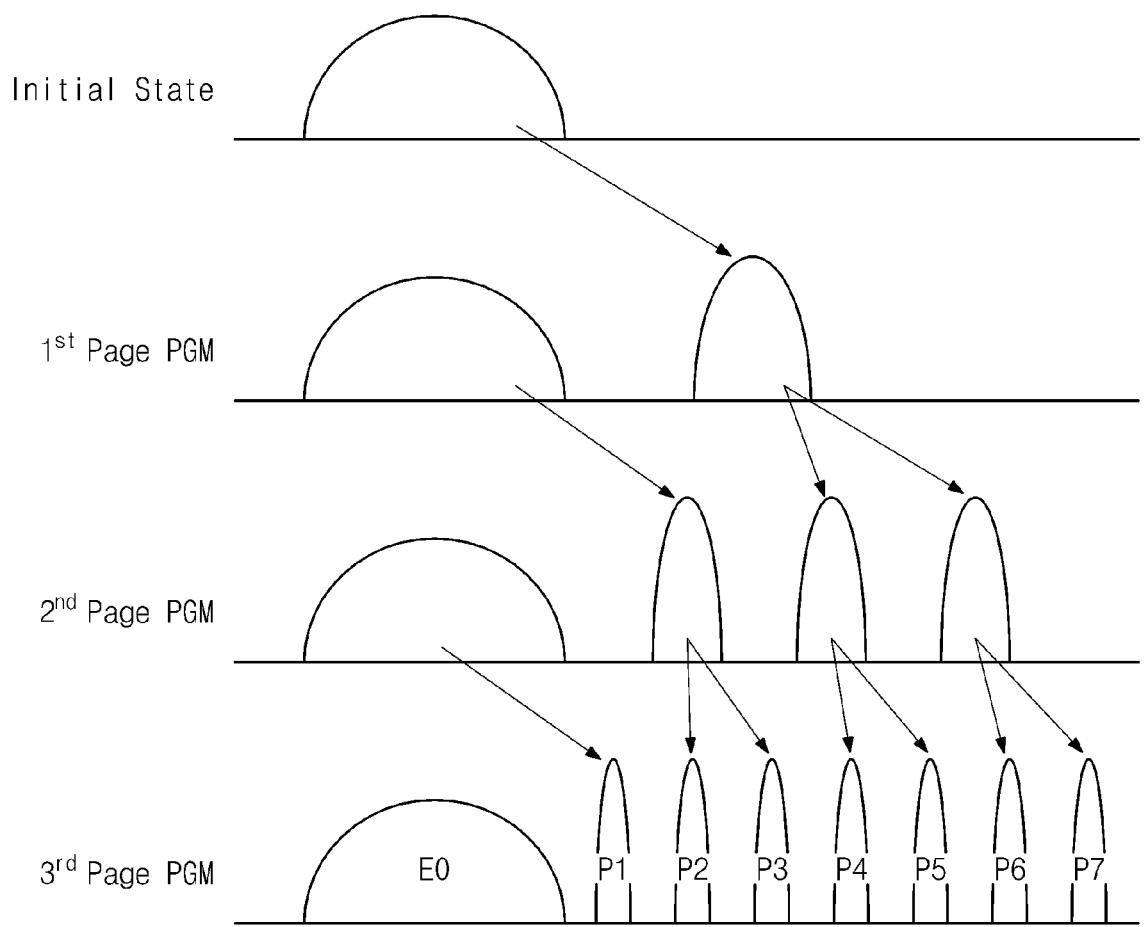
FIG. 20 is a threshold voltage distribution diagram illustrating one possible approach to the programming of an exemplary 3-bit flash memory cell.

Thus afar, the illustrated embodiments have assumed 2-bit flash memory cells. However, the scope of the inventive concept is not limited to only this type of memory cell. For example, FIG. 20 is a threshold voltage diagram illustrating a three-step programming operation for a 3-bit flash memory cell which may be incorporated into the memory cell array of the nonvolatile memory device 1110 of FIG. 2. The exemplary 3-bit flash memory cell of FIG. 20 may be programmed into one of eight (8) data states E0 or P1 through P7 in accordance with corresponding threshold voltage distributions. The complete programming of the memory cell from an initial erase state E0 requires three sequential programming operations (or steps) a Least Significant Bit (LSB) programming operation, followed by a Next Significant Bit (NSB) programming operation, followed by a Most Significant Bit (MSB) programming operation.

From the initial erase state E0, the LSB programming operation will program a least significant bit by either retaining the memory cell state at the erase state E0, or programming the memory cell to a first intermediate state P01. Next, the NSB programming operation will program the corresponding next significant bit by either retaining the memory state at the erase state E0, programming the erase state to a second intermediate program state P02, or programming the first intermediate state P01 to a third intermediate program state P03 or programming the first intermediate state P01 to a fourth intermediate programming state P04. Finally, the MSB programming operation will program the corresponding most bit to place the memory cell into the erase state, or one of the seven program states P1-P7.

Figure 21:
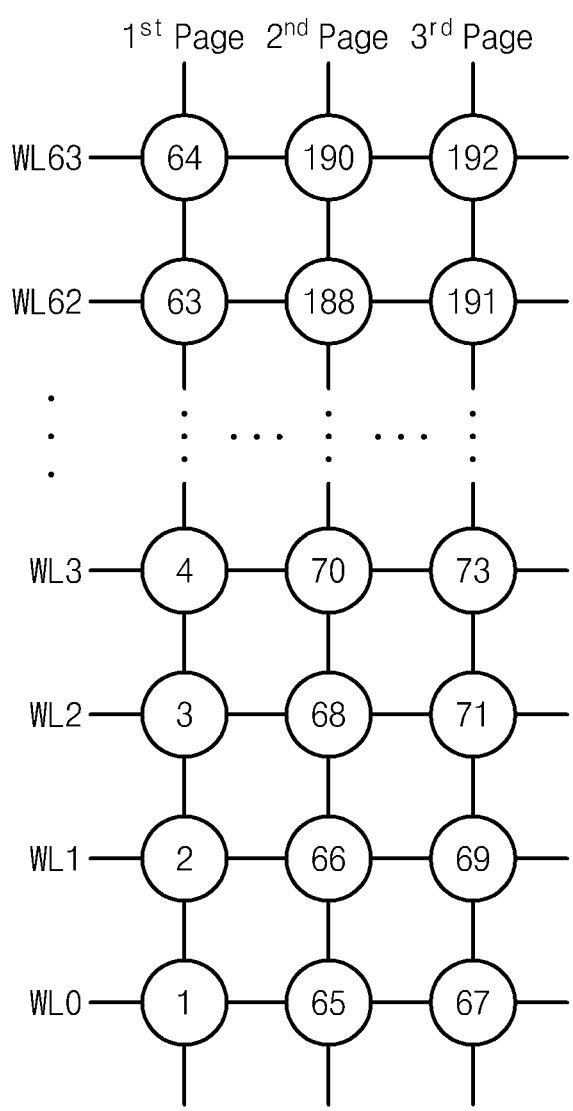
FIGS. 21, 22 and 23 illustrate different program sequences that may be used to program the flash memory device of FIG. 2 which incorporates the 3-bit MLC of FIG. 20 and which decreases the possibility of unintentionally changing of the threshold voltage of the 3-bit MLC during programming.
Figure 22:
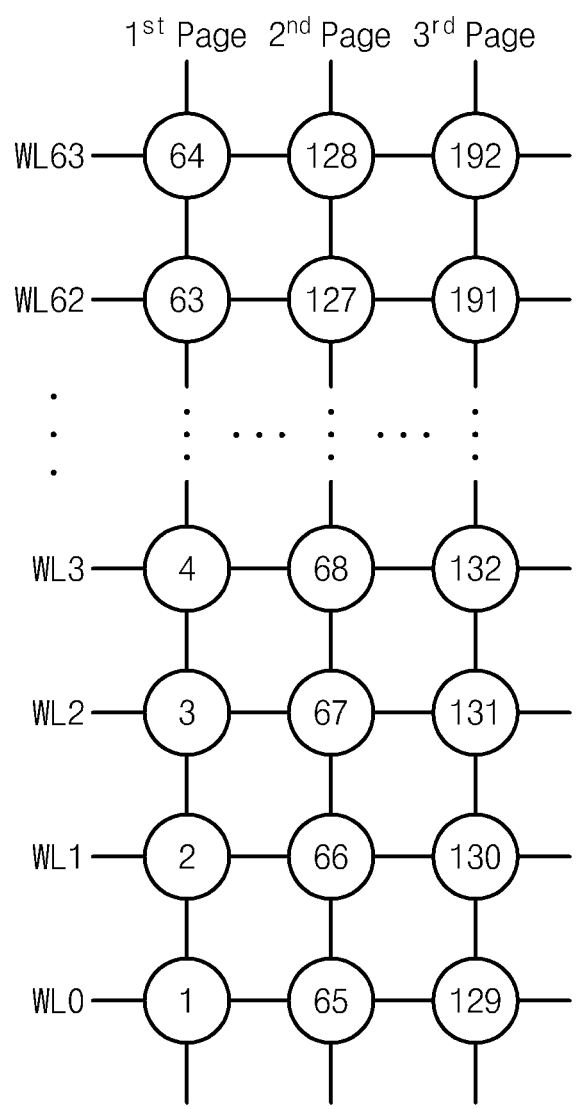
Figure 23:
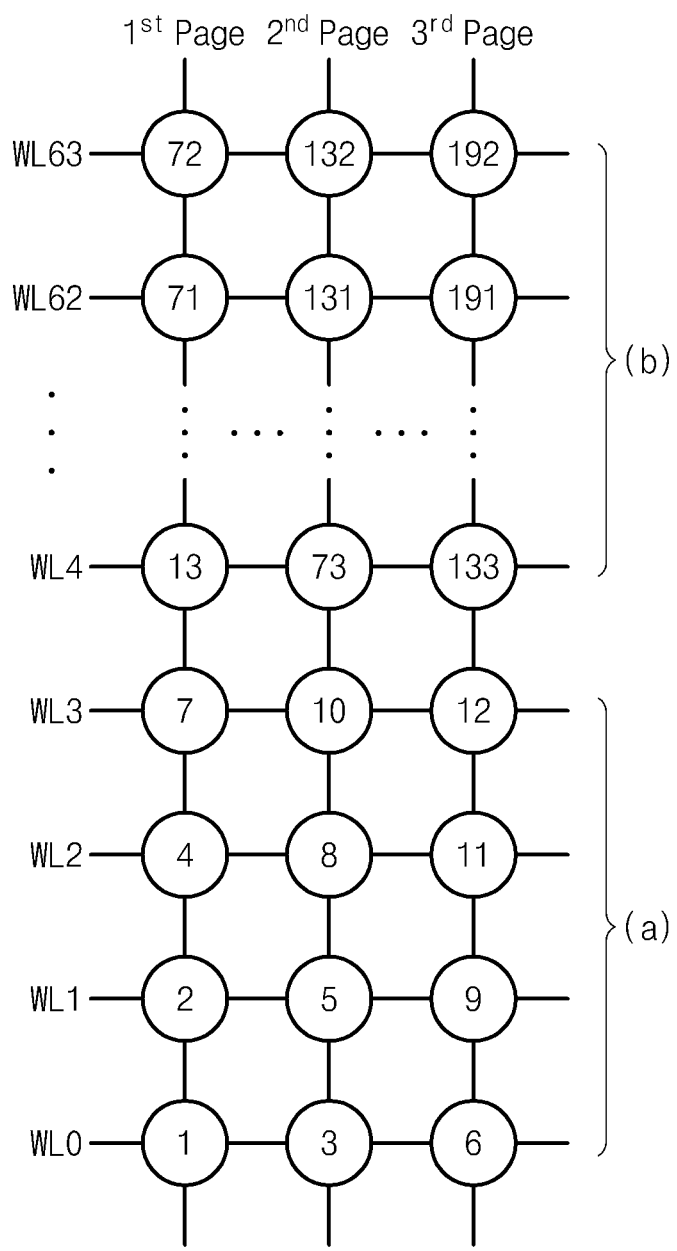

FIGS. 21, 22 and 23 illustrate various program sequences consistent with embodiments of the inventive concept that tend to decrease the possibility of unintentional changes to the threshold voltage of the 3-bit MLC illustrated in FIG. 20. In this regard, the exemplary program sequences for a 3-bit MLC may be variously implemented using sequential and non-sequential approaches, such as those described above in relation to FIGS. 4, 14 and 19.

For example, FIG. 21 illustrates a fully sequential program sequence for the 3-bit MLC of FIG. 20. Referring to FIG. 21, first page (LSB) programming is the same as an embodiment illustrated in FIG. 4. That is, $1^{st}$ through $64^{th}$ logical pages are sequentially programmed in the layout order the word lines WL0 to WL63 associated with the physical pages during a first page programming operation.

Then during a combined second (NSB) and third (MSB) page programming operation a lower bit page in an upper physical page and programs an upper bit page in a lower physical page. Referring to FIG. 21, a 65th logical page is first LSB-programmed in the WL0 physical page. Next, a 66th logical page is LSB-programmed in the WL1 physical page, and a 67th logical page is MSB-programmed in the WL0 physical page. In this way, a 190th logical page is LSB-programmed in the WL63 physical page, and a 191st logical page is MSB-programmed in the WL62 physical page. Finally, a 192nd logical page is MSB-programmed in the WL63 physical page.

FIG. 22 illustrates another embodiment of the 3-bit MLC program sequence. Referring to FIG. 22, first page programming is performed in the same method as an embodiment of the 2-bit MLC. That is, first to 64th logical pages are sequentially programmed in the WL0 to WL63 physical pages during a first page programming operation, 65th to 128th logical pages are sequentially programmed in the WL0 to WL63 physical pages during a second page programming operation, and 129th to 192nd logical pages are sequentially programmed in the WL0 to WL63 physical pages during a third page programming operation.

FIG. 23 illustrates another embodiment of the 3-bit MLC program sequence. Referring to FIG. 23, a program sequence for the WL0 to WL3 physical pages (a) is performed in a method similar to the second and third page programming of an embodiment of the 3-bit MLC, and a program sequence for the WL4 to WL63 physical pages (b) is performed in the same method as the second and third page programming of another embodiment (see FIG. 22) of the 3-bit MLC.

Flash memory systems according to embodiments of the inventive concept, like the one illustrated in FIG. 2, may be variously incorporated into a number of different host devices, and/or implemented in a number of different configurations and form factors. For example, flash memory systems according to embodiments of the inventive concept may be implemented as electronic devices such as personal computers, digital cameras, camcorders, portable terminals, MP3s, PMPs, PSPs and PDAs, and storage devices such as memory cards, USB memories and Solid State Drives (SSDs).

Figure 24:
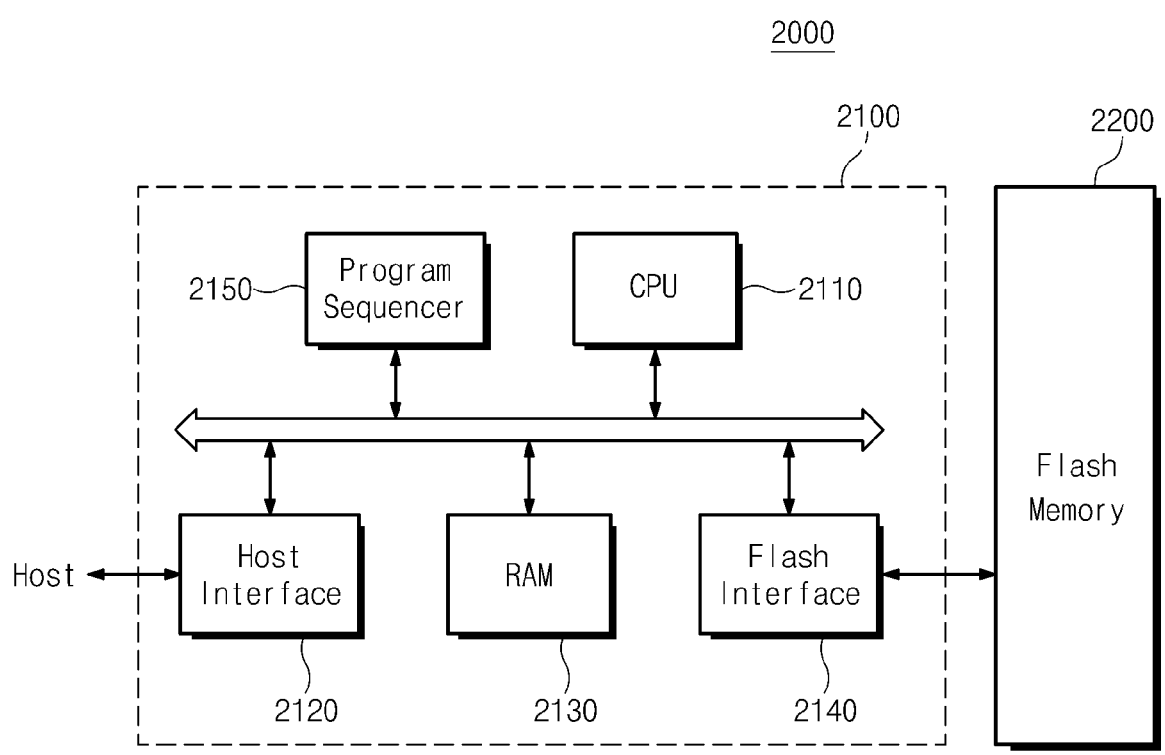
FIG. 24 is a block diagram of a flash memory system according to an embodiment of the inventive concept.

FIG. 24 is a general block diagram of a flash memory system according to an embodiment of the inventive concept. Referring to FIG. 24, a flash memory system 2000 comprises a memory controller 2100 and a flash memory device 2200 and may be configured as a memory card (e.g., a SD, or a MMC) or as a storage medium such as an attachable mobile storage device (e.g., a USB memory).

Referring to FIG. 24, the memory controller 2100 comprises a Central Processing Unit (CPU) 2110, a host interface 2120, a Random Access Memory (RAM) 2130, a flash interface 2140, and a program sequencer 2150. The program sequencer 2150 may be managed in a mapping table type by a constituent Flash Transition Layer (FTL). The operation principles for the program sequencer 2150 may be as described with reference to FIG. 2.

The flash memory system 2000 may be operatively connected to a variety of hosts. The flash memory system 2000 exchanges data with the host through the host interface 2120, and exchanges data with the flash memory device 2200 through the flash interface 2140. The flash memory system 2000 receives a power source from the host and performs an internal operation.

The flash memory system 2000 according to an embodiment of the inventive concept may control the program sequence of the flash memory device 2200 through the program sequencer 2150. A method for controlling the program sequence of the flash memory device 2200 is as described above.

Figure 25:
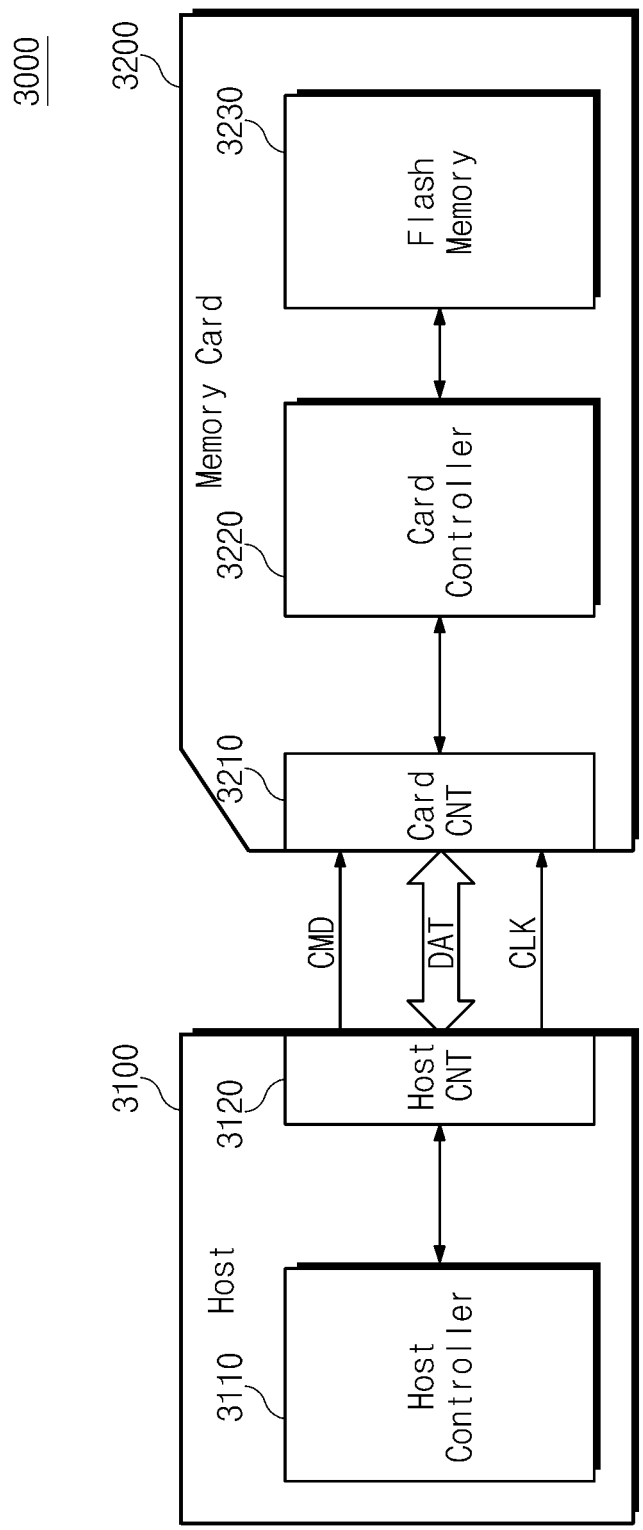
FIG. 25 is a block diagram of a flash memory system according to another embodiment of the inventive concept implemented as a memory card.

FIG. 25 illustrates another example of a flash memory system according to an embodiment of the inventive concept configured as a memory card.

Referring to FIG. 25, a memory card system 3000 comprises a host 3100 and a memory card 3200. The host 3100 includes a host controller 3110 and a host connection unit 3120. The memory card 3200 includes a card connection unit 3210, a card controller 3220, and a flash memory device 3230. Herein, the card controller 3220 or the flash memory device 3230 may include the above-described program sequencer (not shown).

The host 3100 writes data in the memory card 3200, or reads data that is stored in the memory card 3200. The host controller 3110 transmits a command (for example, a writing command), a clock signal CLK that is generated by a clock generator (not shown) of the host 3100 and a data DATA to the memory card 3200 through the host connection unit 3120.

The card controller 3220 stores data in the flash memory device 3230 in synchronization with a clock signal that is generated by a clock generator (not shown) of the card controller 3220, in response to a writing command that is received through the card connection unit 3210. The flash memory 3230 stores data that is transmitted from the host 3100. For example, when the host 3100 is a digital camera, the flash memory 3230 stores video data.

The memory card 3200 of FIG. 25 may control the program sequence of the flash memory device 3230 through a program sequence (not shown). A method for controlling the program sequence of the flash memory device 3230 is as described above.

Figure 26:
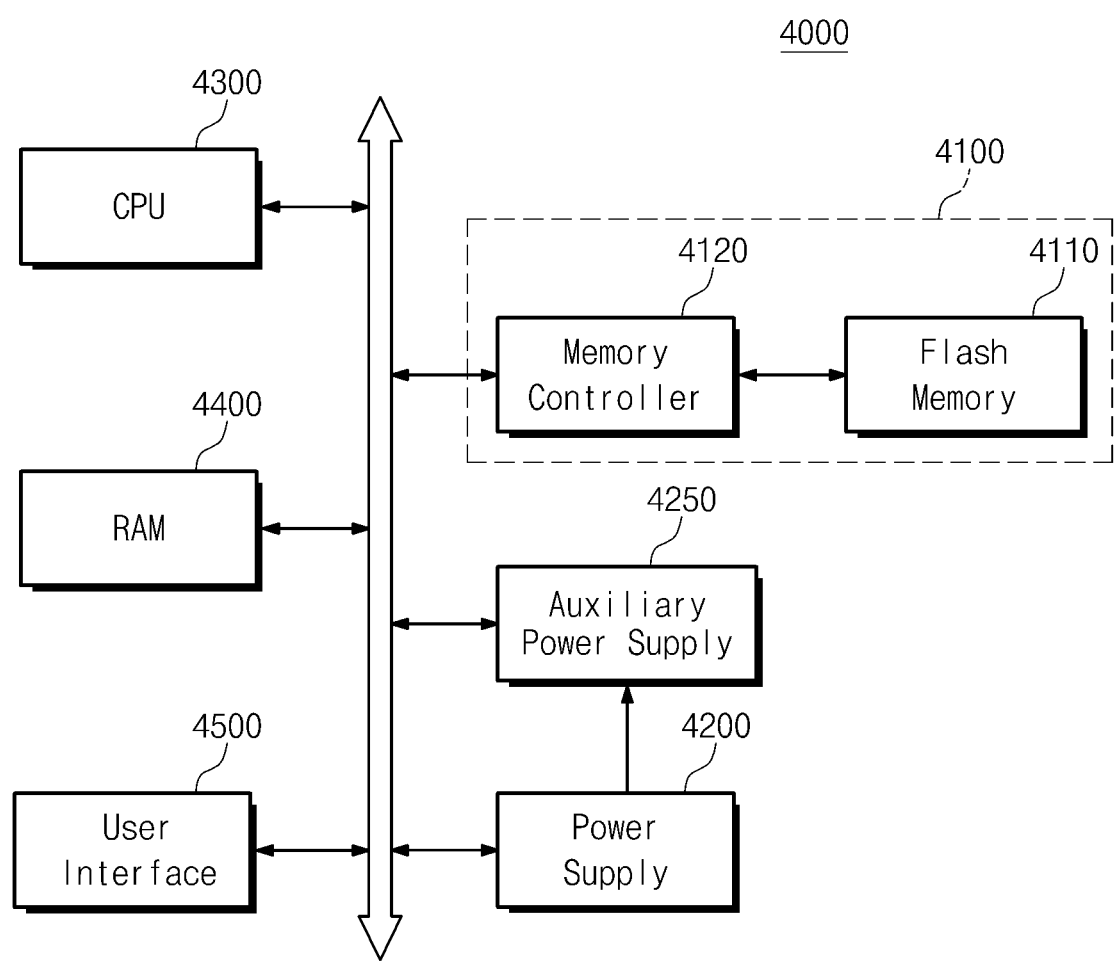
FIG. 26 is a block diagram of an electronic device incorporating a flash memory system according to an embodiment of the inventive concept.

FIG. 26 is a block diagram of an electronic device 4000 incorporating a flash memory system according to an embodiment of the inventive concept. The electronic device 4000 may be implemented as a Personal Computer (PC) or a portable electronic device such as a notebook computer, a portable terminal, a Personal Digital Assistant (PDA) and a camera.

Referring to FIG. 26, the electronic device 4000 comprises a flash memory system 4100, a power supply 4200, an auxiliary power supply 4250, a CPU 4300, a RAM 4400, and a user interface 4500. The flash memory system 4100 includes a flash memory device 4110 and a memory controller 4120. Herein, the flash memory device 4110 or the memory controller 4120 may include the above-described program sequencer (not shown).

The electronic device 4000 of FIG. 26 may control the program sequence of the flash memory device 4110 through a program sequence (not shown). A method for controlling the program sequence of the flash memory device 4110 is as described above.

Figure 27:
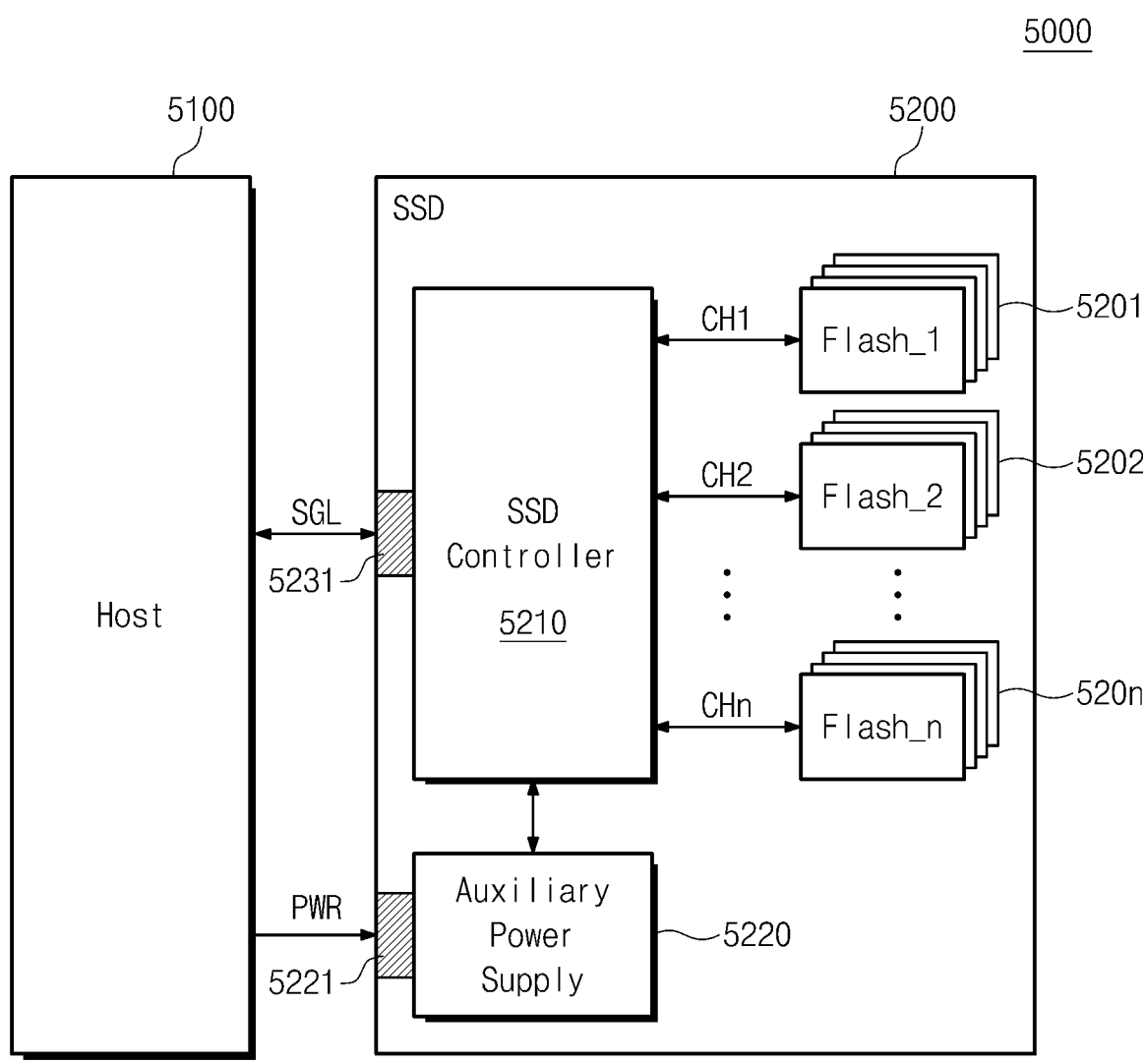
FIG. 27 is a block diagram of a flash memory system according to an embodiment of the inventive concept implemented as a Solid State Disk (SSD)

FIG. 27 is a block diagram of another a flash memory system according to an embodiment of the inventive concept implemented as a Solid State Disk (SSD) 5200 connected to a host 5100 in a general computational system 5000.

Referring to FIG. 27, a SSD 5200 exchanges data with the host 5100 through a signal connector 5211, and receives a power source through a power connector 5231. The SSD 5200 includes a plurality of flash memory devices 5201 to 520n, an SSD controller 5210, and an auxiliary power supply 5220. Herein, the flash memory devices 5201 to 520n or the SSD controller 5210 may include the above-described program sequencer (not shown).

The flash memory devices 5201 to 520n are used as a storage medium of the SSD 5200. A flash memory and a nonvolatile memory device such as PRAM, MRAM, ReRAM and FRAM may be used as the SSD 5200. The flash memory devices 5201 to 520n may be connected to the SSD controller 5210 through a plurality of channels CH1 to CHn. One or more flash memory devices may be connected to one channel. Flash memory devices connected to one channel may be connected to the same data bus.

The SSD controller 5210 exchanges a signal SGL with the host 5100 through the signal connector 5211. Herein, the signal SGL may include a command, an address and data. The SSD controller 5210 writes data in a corresponding flash memory device or reads data from a corresponding flash memory device according to a command of the host 1100. The internal configuration of the SSD controller 5210 will be described in some additional detail with reference to FIG. 28.

The auxiliary power supply 5220 is connected to the host 5100 through the power connector 5221. The auxiliary power supply 5220 may receive a power source PWR from the host 5100 and perform charging. The auxiliary power supply 5220 may be disposed inside or outside the SSD 5200. For example, the auxiliary power supply 5220 is disposed in a main board, and may provide an auxiliary power source to the SSD 5200.

Figure 28:
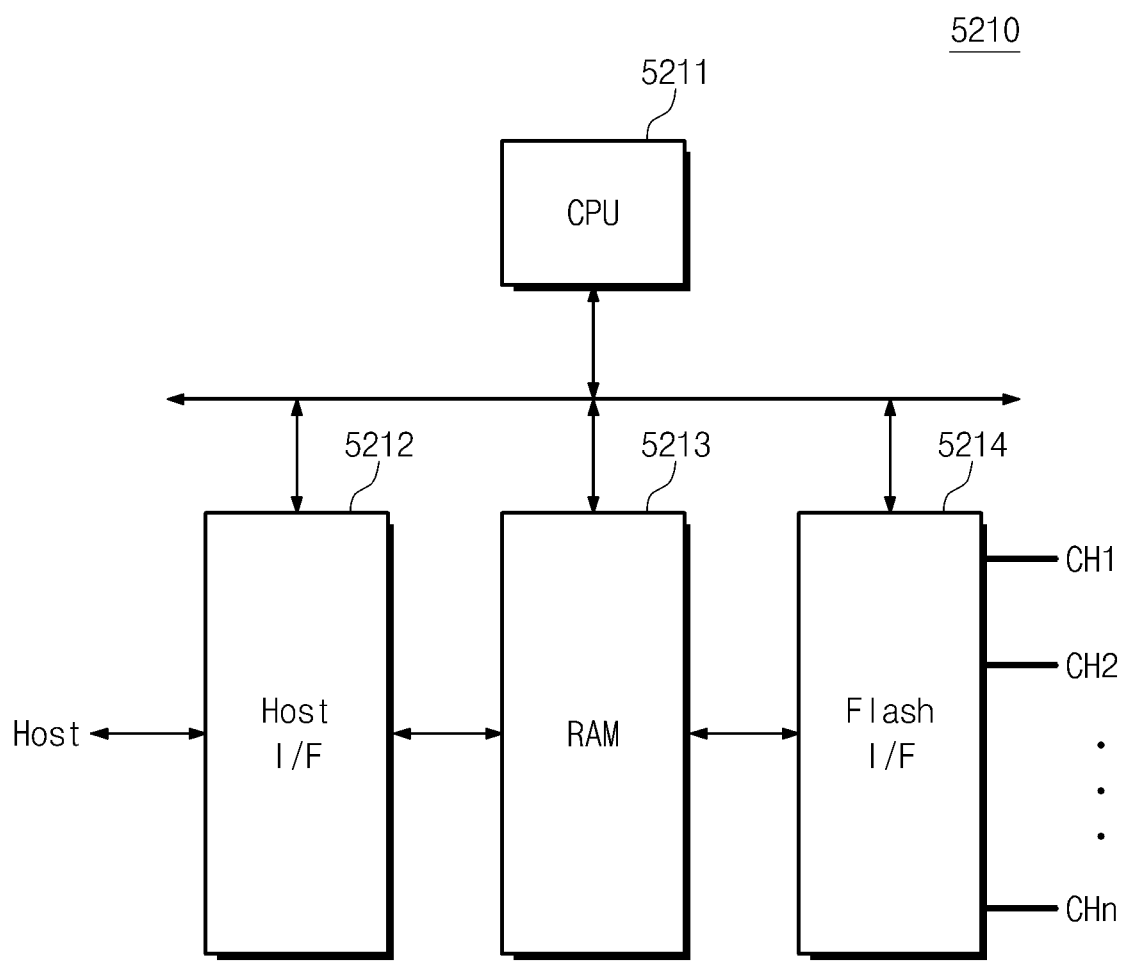
FIG. 28 is a block diagram further illustrating one possible configuration for the SSD controller of FIG. 27.

FIG. 28 is a block diagram further illustrating one possible configuration for the SSD controller 5210 of FIG. 27.

Referring to FIG. 28, the SSD controller 5210 includes a CPU 5211, a host interface 5212, a RAM 5213, and a flash interface 5214.

The CPU 5211 analyzes and processes a signal SGL that is inputted from the host 5100 (see FIG. 27). The CPU 5211 controls the host 5100 or the flash memory devices 5201 to 520n through the host interface 5212 or the flash interface 5214. The CPU 5211 controls the operations of the flash memory devices 5201 to 520n according a firmware for driving the SSD 5200.

The host interface 5212 provides interfacing with the SSD 5200 according to a protocol of the host 5100. The host interface 5212 may communicate with the host 5100 by using Universal Serial Bus (USB), Small Component Small Interface (SCSI), Peripheral Component Interconnection (PCI) Express, Advanced Technology Attachment (ATA), Parallel-ATA (PATA), Serial-ATA (SATA) and Serial Attached SCSI (SAS). Moreover, the host interface 5212 may perform a disk emulation function that provides support in order for the host 5100 to recognize the SSD 5200 as a Hard Disk Drive (HDD).

The RAM 5213 temporarily stores a writing data provided from the host 5100 and data that is read from a flash memory device. The RAM 5213 may store metadata or cache data to be stored in the flash memory devices 5201 to 520n. In a sudden power-off operation, metadata or cache data that is stored in the RAM 5213 is stored in the flash memory devices 5201 to 520n. The RAM 5213 may include a DRAM and an SRAM.

The flash interface 5214 scatters data, which is transferred from the RAM 5213, onto channels CH1 to CHn. The flash interface 5214 transfers data, which is read from the flash memory devices 5201 to 520n, to the RAM 5213.

The SSD 5200 of FIG. 27 may control the program sequences of the flash memory devices 5201 to 520n through a program sequence (not shown). A method for controlling the program sequences of the flash memory devices 5201 to 520n is as described above.

FIGS. 29 through 33 illustrate additional examples of a flash memory device according to embodiments of the inventive concept, wherein the constituent memory cell array is configured in a Three-Dimensional (3D) arrangement.

Figure 29:
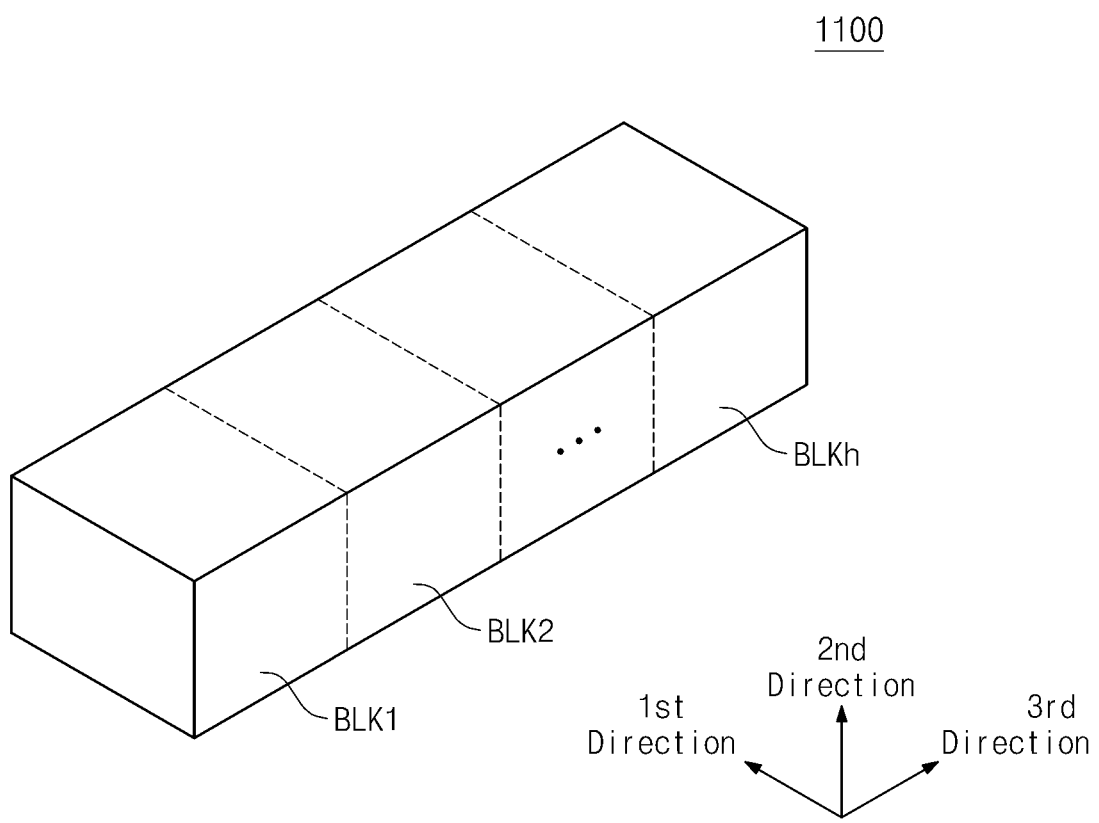
FIGS. 29 through 33 variously illustrate a flash memory device according to certain embodiments of the inventive concept implemented with a Three-Dimensional (3D) memory cell array.

For example, FIG. 29 is a block diagram illustrating a multi-block, 3D memory cell array capable of being incorporated into the nonvolatile memory device 1100 of FIG. 2. Referring to FIGS. 2 and 29, the memory cell array 1110 comprises a plurality of memory blocks BLK1 to BLKh. Each memory block BLK has a 3D structure (or vertical structure). For example, the each memory block BLK includes structures that are expanded in first to third directions.

The each memory block BLK includes a plurality of NAND strings NS that are expanded in the second direction. The plurality of NAND strings NS are provided in the first to third directions. The each NAND string NS is connected to a bit line BL, at least one string selection line SSL, at least one ground selection line GSL, a plurality of word lines WL, at least one dummy word line DWL, and a common source line CSL. That is, respective memory blocks are connected to a plurality of bit lines BL, a plurality of string selection lines SSL, a plurality of ground selection lines GSL, a plurality of word lines WL, a plurality of dummy word lines DWL, and a plurality of common source lines CSL. The memory blocks BLK1 to BLKh will be described in some additional detail with reference to FIG. 30.

Figure 30:
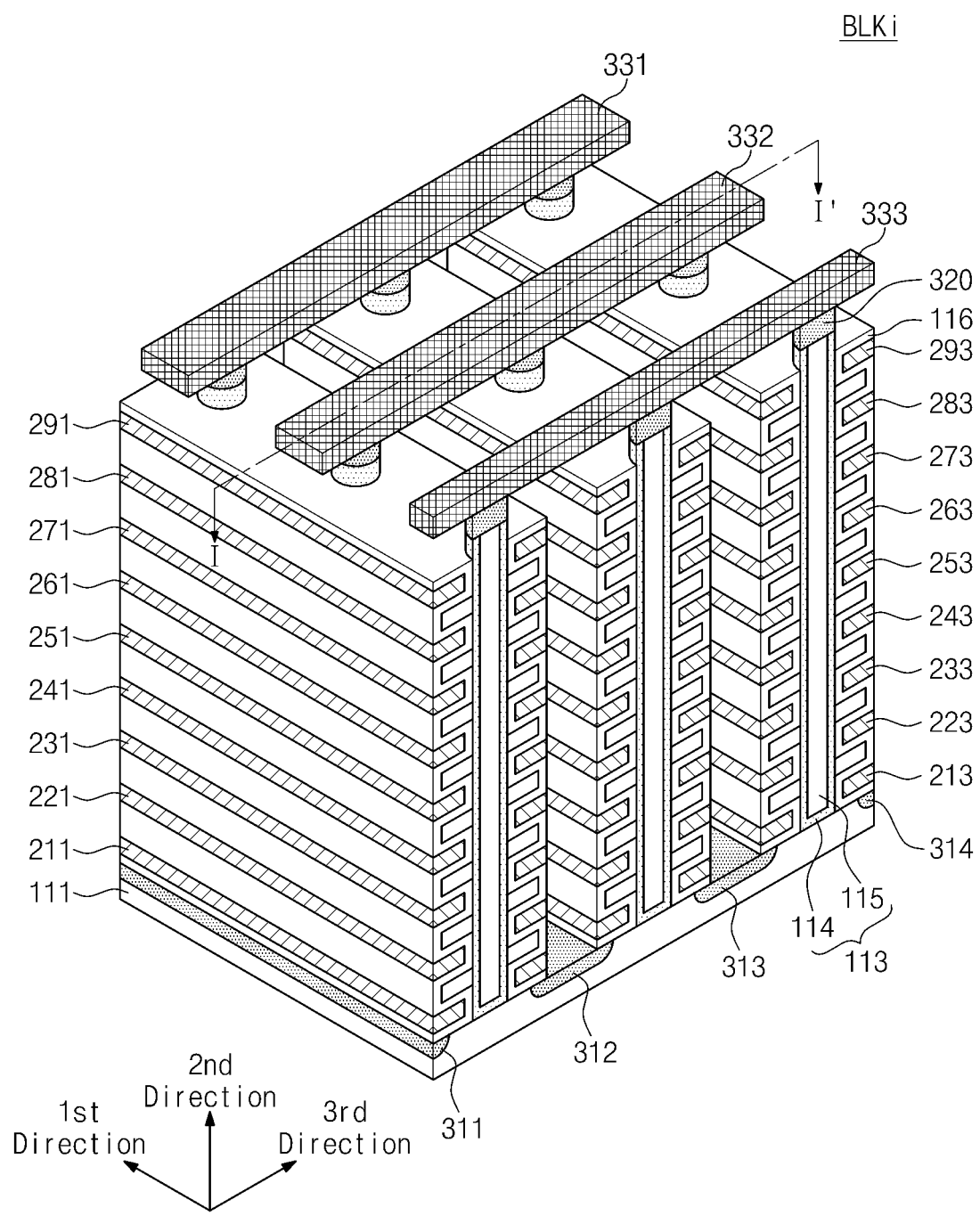
Figure 31:
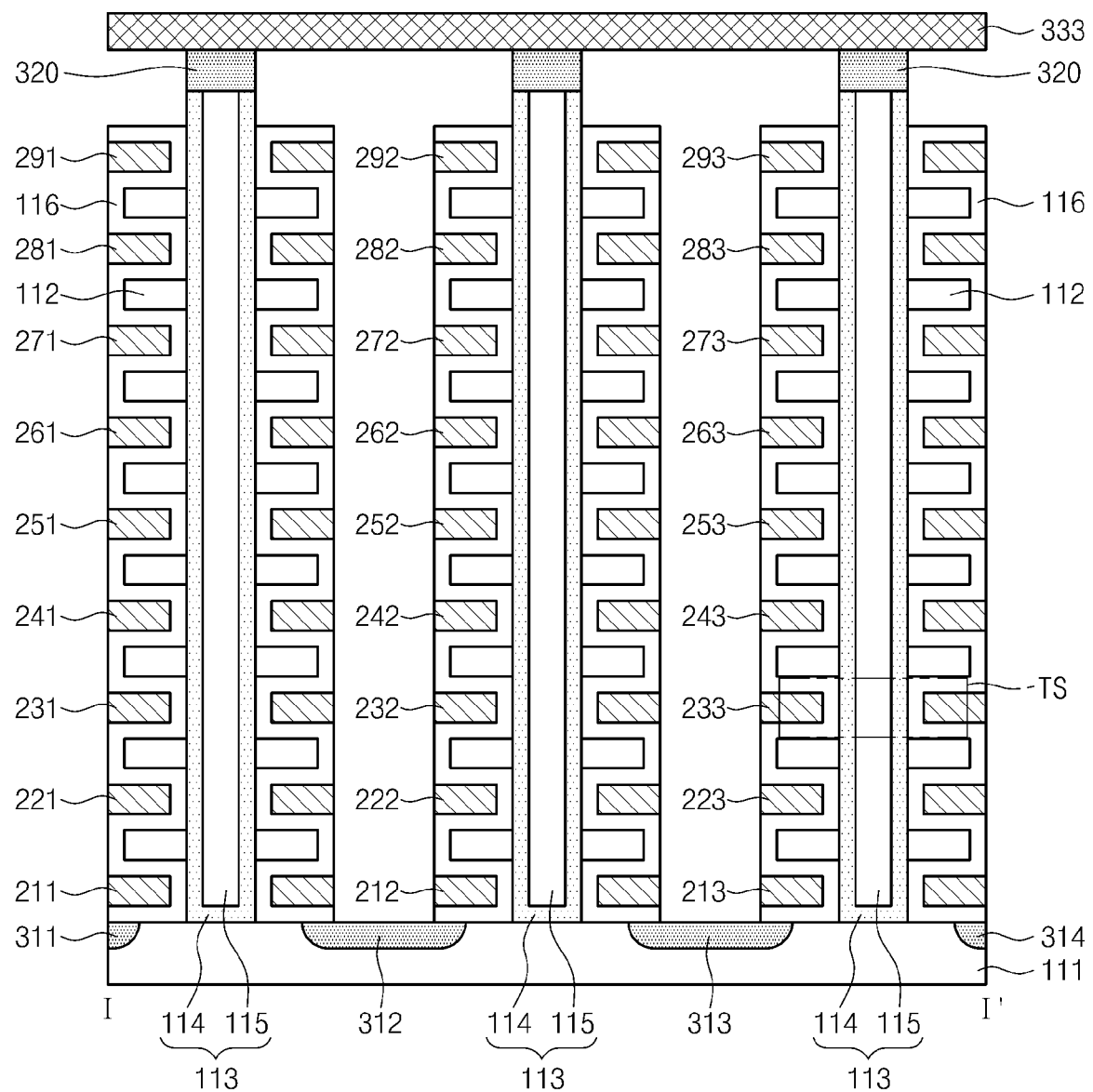

FIG. 30 is a perspective view exemplarily illustrating the memory block BLKi of FIG. 29. FIG. 31 is a cross-sectional view taken along line I-I' of the memory block BLKi of FIG. 30.

Referring to FIGS. 30 and 31, the memory block BLKi includes structures that are expanded in the first to third directions.

First, a substrate 111 is provided. Exemplarily, the substrate 111 may include a silicon material on which first-type impurities are doped. For example, the substrate 111 may include a silicon material on which p-type impurities are doped or may be a p-type well (for example, a pocket p well), and it may further include an n-type well surrounding the p-type well. Hereinafter, it is assumed that the substrate 111 is p-type silicon. However, the substrate 111 is not limited to the p-type silicon.

A plurality of doping regions 311 to 314 that are expanded in a first direction are provided on the substrate 111. For example, the doping regions 311 to 314 have a second type different from that of the substrate 111. For example, the doping regions 311 to 314 have an n type. Hereinafter, it is assumed that first to fourth doping regions 311 to 314 are an n type. However, the first to fourth doping regions 311 to 314 are not limited to the n type.

In a region on the substrate 111 corresponding between the first and second doping regions 311 and 312, a plurality of insulating materials 112 expanded in the first direction are sequentially provided in a second direction. For example, the insulating materials 112 and the substrate 111 are provided to be separated by a distance that is predetermined in the second direction. For example, the insulating materials 112 are provided to be separated by a distance that is predetermined in the second direction. Exemplarily, the insulating materials 112 may include an insulating material such as silicon oxide.

In a region on the substrate 111 corresponding between the first and second doping regions 311 and 312, provided are a plurality of pillars 113 that are sequentially disposed in the first direction and pass through the insulating materials 112 in the second direction. Exemplarily, each of the pillars 113 passes through the insulating materials 112 and is connected to the substrate 111.

Exemplarily, the each pillar 113 may be formed of a plurality of materials. For example, the surface layer 114 of the each pillar 113 may include a silicon material that is doped in a first type. For example, the surface layer 114 of the each pillar 113 may include a silicon material that is doped in the same type as that of the substrate 111. Hereinafter, it is assumed that the surface layer 114 of the each pillar 113 includes p-type silicon. However, the surface layer 114 of the each pillar 113 is not limited to that it includes the p-type silicon.

The inner layer of the each pillar 113 is formed of an insulating material. For example, the inner layer 115 of the each pillar 113 is charged with an insulating material such as silicon oxide.

In a region between the first and second doping regions, a dielectric 116 is provided along the insulating materials 112, the pillars 113 and the exposed surface of the substrate 111. Exemplarily, the thickness of the dielectric 116 is less than half of a distance between the insulating materials 112. That is, a region, in which materials other than the insulating materials 112 and the dielectric 116 may be disposed, is provided between the dielectric 116 provided to a lower surface of a first insulating material among the insulating materials and the dielectric 116 that is provided to an upper surface of a second insulating material in a lower portion of the first insulating material.

In a region between the first and second doping regions, conductive materials 211 to 291 are provided onto an exposed surface of the dielectric 116. For example, the conductive material 211 expanded in the first direction is provided between the substrate 111 and the insulating material 112 adjacent to the substrate 111. More specifically, the conductive material 211 expanded in the first direction is provided between the substrate 111 and the dielectric 116 of a lower surface of the insulating material 112 adjacent to the substrate 111.

A conductive material expanded in the first direction is provided between the dielectric 116 of an upper surface of a specific insulating material among the insulating materials 112 and the dielectric 116 of a lower surface of an insulating material that is disposed at an upper portion of the specific insulating material. Exemplarily, the plurality of conductive materials 221 to 281 expanded in the first direction is provided between the insulating materials 112. Moreover, the conductive material 291 expanded in the first direction is provided to a region on the insulating materials 112. Exemplarily, the conductive materials 211 to 291 expanded in the first direction may be metal materials. Exemplarily, the conductive materials 211 to 291 expanded in the first direction may be conductive materials such as poly silicon.

In a region between the second and third doping regions 312 and 313, provided is a structure that is identical to a structure on the first and second doping regions 311 and 312. In a region between the second and third doping regions 312 and 313, exemplarily, provided are the insulating materials 112 expanded in the first direction, the plurality of pillars 113 that are sequentially disposed in the first direction and pass through the insulating materials 112 in the third direction, the dielectric 116 that is provided to the exposed surfaces of the pillars 113 and the insulating materials 112, and the conductive materials 212 to 292 expanded in the first direction.

In a region between the third and fourth doping regions 313 and 314, provided is a structure that is identical to a structure on the first and second doping regions 311 and 312. In a region between the third and fourth doping regions 312 and 313, exemplarily, provided are the insulating materials 112 expanded in the first direction, the plurality of pillars 113 that are sequentially disposed in the first direction and pass through the insulating materials 112 in the third direction, the dielectric 116 that is provided to the exposed surfaces of the pillars 113 and the insulating materials 112, and the conductive materials 213 to 293 expanded in the first direction.

Drains 320 are respectively provided onto the plurality of pillars 113. Exemplarily, the drains 320 may be silicon materials that are doped in a second type. For example, the drains 320 may be silicon materials that are doped in an n type. Hereinafter, it is assumed that the drains 320 include n-type silicon. However, the drains 320 are not limited to that they include n-type silicon. Exemplarily, the width of each of the drains 320 may be greater than that of a corresponding pillar 113. For example, the each drain 320 may be provided to an upper surface of a corresponding pillar 113 in a pad type.

Conductive materials 331 to 333 extended in the third direction are provided onto the drains 320. Conductive materials 331 to 333 are sequentially disposed in the first direction. The conductive materials 331 to 333 are respectively connected to the drains 320 of a corresponding region. Exemplarily, the drains 320 and the conductive material 333 expanded in the third direction may be connected through a contact plug. Exemplarily, the conductive materials 331 to 333 expanded in the third direction may be metal materials.

Exemplarily, the conductive materials 331 to 333 expanded in the third direction may be conductive materials such as poly silicon.

In FIGS. 30 and 31, the each pillar 113 forms a string together with a region adjacent to the dielectric 116 and an adjacent region among the plurality of conductor lines 211 to 291, 212 to 292 and 213 to 293 that are expanded in the first direction. For example, the each pillar 113 forms a NAND string NS together with a region adjacent to the dielectric 116 and an adjacent region among the plurality of conductor lines 211 to 291, 212 to 292 and 213 to 293 that are expanded in the first direction. The NAND string NS includes a plurality of transistor structures TS. The transistor structure TS will be described in detail with reference to FIG. 32.

Figure 32:
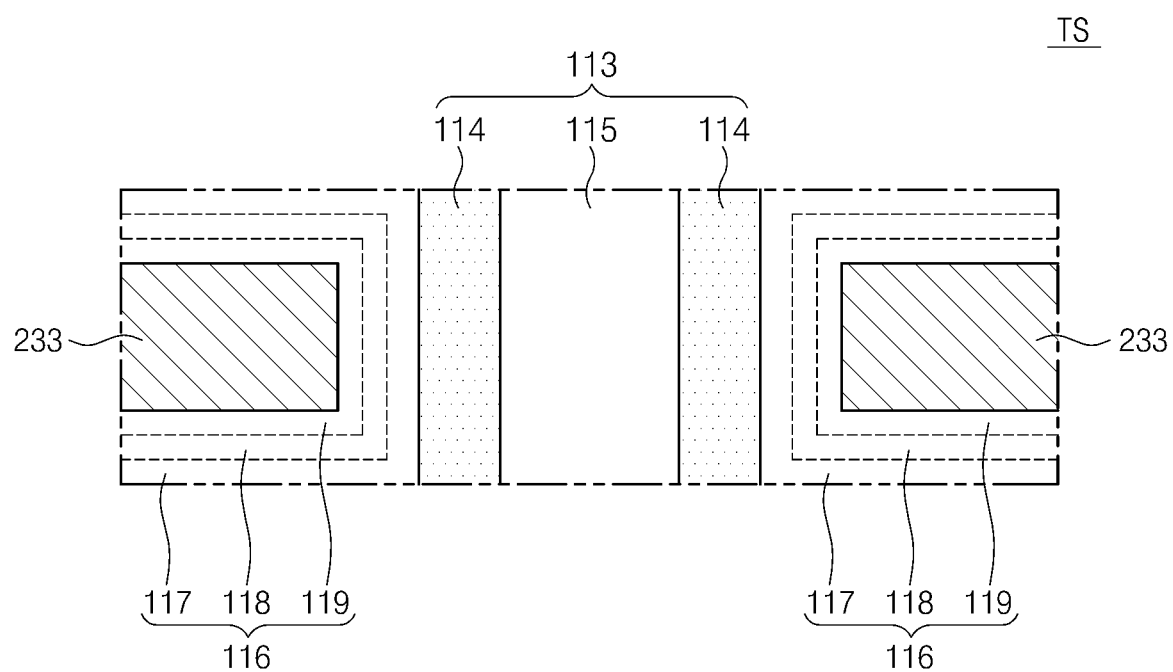

FIG. 32 is a cross-sectional view illustrating the transistor structure TS of FIG. 31.

Referring to FIGS. 30 to 32, the dielectric 116 includes first to third sub-dielectrics 117 to 119.

A p-type silicon 114 of the pillar 113 may serve as a body. The first sub-dielectric 117 adjacent to the pillar 113 may serve as a tunneling dielectric. For example, the first sub-dielectric 117 adjacent to the pillar 113 may include thermal oxide.

The second sub-dielectric 118 may serve as a charge storage layer. For example, the second sub-dielectric 118 may serve as a charge trapping layer. For example, the second sub-dielectric 118 may include a nitride layer or a metal oxide layer (for example, aluminum oxide layer, and hafnium oxide layer).

The third sub-dielectric 119 adjacent to the conductive material 233 may serve as a blocking dielectric. Exemplarily, the third sub-dielectric 119 adjacent to the conductive material 233 expanded in the first direction may be formed as a single layer or a multi layer. The third sub-dielectric 119 may be a high dielectric (for example, aluminum oxide layer, and hafnium oxide layer) having a dielectric constant higher than those of the first and second sub-dielectrics 117 and 118.

The conductive material 233 may serve as a gate (or control gate). That is, the gate 233 (or control gate), the blocking dielectric 119, the charge storage layer 118, the tunneling dielectric 117 and the body 114 may form a transistor (or a memory cell transistor structure). Exemplarily, the first to third sub-dielectrics 117 to 119 may form Oxide-Nitride-Oxide (ONO). Hereinafter, the p-type silicon 114 of the pillar 113 may be called a body of the second direction.

The memory block BLKi includes a plurality of pillars 113. That is, the memory block BLKi includes a plurality of NAND strings NS. More specifically, the memory block BLKi includes a plurality of NAND strings NS that are expanded in the second direction (or the direction vertical to the substrate 111).

Each NAND string NS includes a plurality of transistor structures that are disposed in the second direction. At least one of the transistor structures NS of the each NAND string NS serves as a string selection transistor SST. At least one of the transistor structures NS of the each NAND string NS operates as a ground selection transistor GST.

The gates (or control gates) correspond to the conductive materials 211 to 291, 212 to 292 and 213 to 293 that are expanded in the first direction. That is, the gates (or control gates) are expanded in the first direction and thereby form word lines and at least two selection lines (for example, at least one string selection line SSL and at least one ground selection line GSL).

The conductive materials 331 to 333 expanded in the third direction are connected to the one ends of the NAND strings NS. Exemplarily, the conductive materials 331 to 333 expanded in the third direction operate as the bit lines BL. That is, a plurality of NAND strings are connected to one bit line BL, in one memory block BLKi.

The second-type doping regions 311 to 314 expanded in the first direction are provided to the other ends of the NAND strings NS. The second-type doping regions 311 to 314 expanded in the first direction operate as common source lines CSL.

To sum up the above-described, the memory block BLKi includes a plurality of NAND strings that are expanded in the direction (second direction) vertical to the substrate 111, and operates as a NAND flash memory block (for example, charge trapping type) where a plurality of NAND strings NS are connected to one bit line BL.

In FIGS. 30 to 32, the conductor lines 211 to 291, 212 to 292 and 213 to 293 expanded in the first direction have been described above to be provided to nine layers, but they are not limited thereto. For example, conductor lines expanded in the first direction may be provided to eight layers, sixteen layers or a plurality of layers. That is, in one NAND string, a transistor may be configured as eight or sixteen or in plurality.

In FIGS. 30 to 32, it has been described above that three NAND strings NS are connected to one bit line BL. However, embodiments of the inventive concept are not limited to that three NAND strings NS are connected to one bit line BL. Exemplarily, in the memory block BLKi, an m number of NAND strings NS may be connected to one bit line BL. At this point, the number of the conductive materials 211 to 291, 212 to 292 and 213 to 293 expanded in the first direction and the number of the common source lines 311 to 314 may be controlled in proportion to the number of NAND strings NS connected to one bit line BL.

In FIGS. 30 to 32, it has been described above that three NAND strings NS are connected to one conductive material expanded in the first direction. However, embodiments of the inventive concept are not limited to that three NAND strings NS are connected to one conductive material expanded in the first direction. For example, an n number of NAND strings NS may be connected to one conductive material expanded in the first direction. At this point, the number of the bit lines 331 to 333 may also be controlled in proportion to the number of NAND strings NS that are connected to one conductive material expanded in the first direction.

Figure 33:
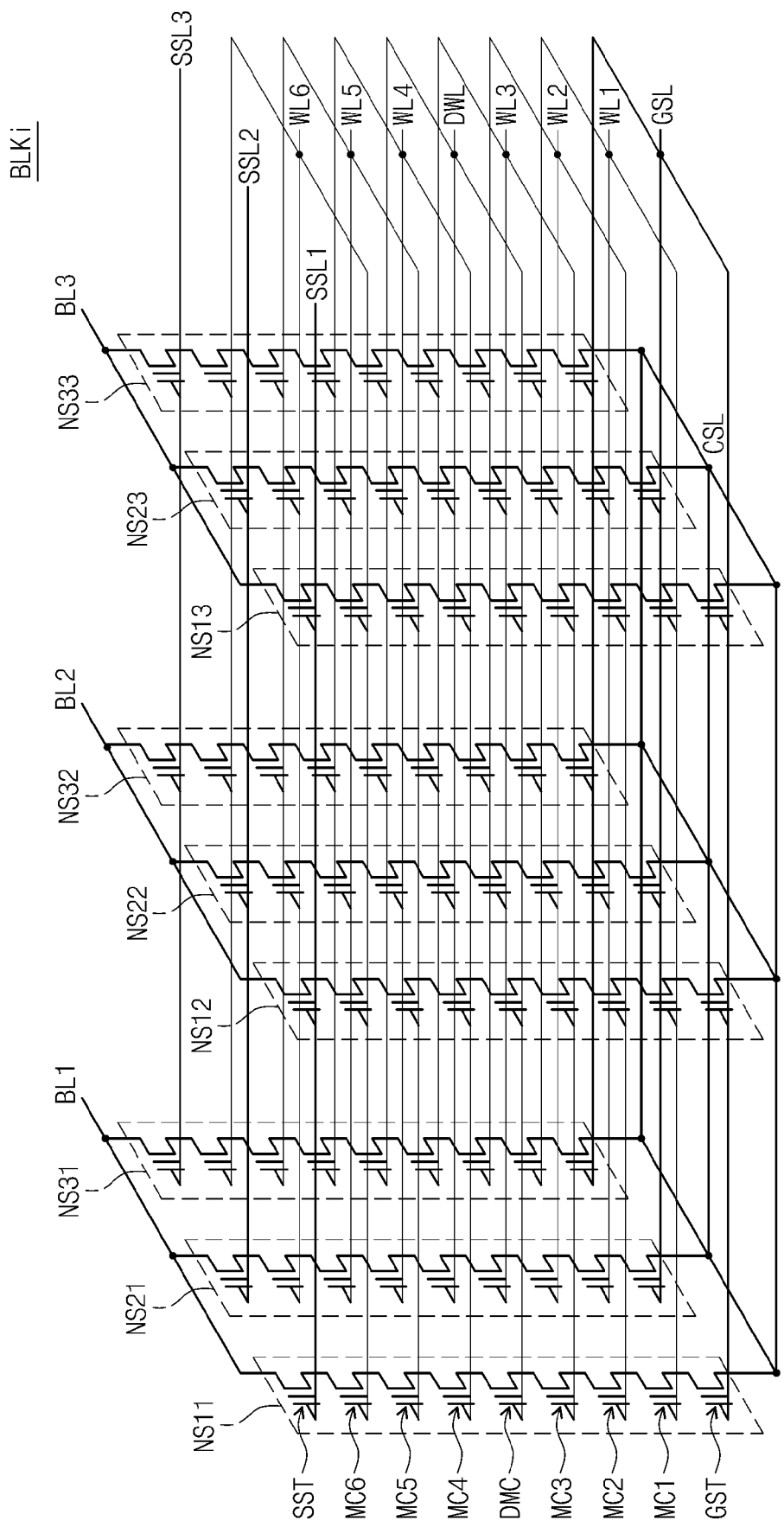

FIG. 33 is a circuit diagram illustrating an equivalent circuit of the memory block BLKi which has been described above with reference to FIGS. 30 to 32.

Referring to FIGS. 30 to 32, NAND strings NS11 to NS31 are provided between a first bit line BL1 and the common source line CSL. The first bit line BL1 corresponds to a conductive material 331 that is expanded in the third direction. NAND strings NS12, NS22 and NS32 are provided between a second bit line BL2 and the common source line CSL. The second bit line BL2 corresponds to a conductive material 332 that is expanded in the third direction. NAND strings NS13, NS23 and NS33 are provided between a third bit line BL2 and the common source line CSL. The third bit line BL2 corresponds to a conductive material 333 that is expanded in the third direction.

The string selection transistor SST of the each NAND string NS is connected to a corresponding bit line BL. The ground selection transistor GST of the each NAND string NS is connected to the common source line CSL. Memory cells MC are provided between the string selection transistor SST and ground selection transistor GST of the each NAND string NS.

Hereinafter, NAND strings NS will define in row and column units. NAND strings NS, which are connected to one bit line in common, forms one column. For example, NAND strings NS11 to NS31 connected to the first bit line BL1 corresponds to a first column. NAND strings NS12 to NS32 connected to the second bit line BL2 corresponds to a second column. NAND strings NS13 to NS33 connected to the third bit line BL3 corresponds to a third column.

NAND strings NS connected to one string selection line SSL forms one row. For example, the NAND strings NS11 to NS13 connected to a first string selection line SSL1 corresponds to a first row. NAND strings NS21 to NS23 connected to a second string selection line SSL2 corresponds to a second row. NAND strings NS31 to NS33 connected to a third string selection line SSL3 corresponds to a third row.

In the each NAND string NS, a height is defined. In the each NAND string NS, exemplarily, the height of a memory cell MC1 adjacent to the ground selection transistor GST is 1. In the each NAND string NS, the more adjacent to the string selection transistor SST the height of each memory cell increases. In the each NAND string NS, the height of a memory cell MC7 adjacent to the string selection transistor SST is 7.

The string selection transistor SST of NAND strings NS on the same row share a sting selection line SSL. The string selection transistors SST of NAND strings NS on different rows are connected to different string selection lines SSL1 to SSL3, respectively.

Memory cells having the same height in NAND strings NS on the same row share a word line WL. In the same height, word lines WL that are connected to the memory cells of NAND strings NS on different rows are connected in common. Dummy memory cells DWL having the same height in NAND strings NS on the same row share a dummy word line DWL. In the same height, dummy word lines DWL that are connected to the dummy memory cells DMC of NAND strings NS on different rows are connected in common.

Exemplarily, word lines WL or dummy word lines DWL may be connected in common at a layer to which the conductive materials 211 to 291, 212 to 292 and 213 to 293 expanded in the first direction are provided. Exemplarily, the conductive materials 211 to 291, 212 to 292 and 213 to 293 expanded in the first direction are connected to an upper layer through a contact. The conductive materials 211 to 291, 212 to 292 and 213 to 293 expanded in the first direction may be connected in common, at the upper layer.

The ground selection transistor GST of NAND strings NS on the same row share a ground selection line GSL. The ground selection transistor GST of NAND strings NS on different rows share the ground selection line GSL. That is, NAND strings NS 11 to NS13, NS21 to NS23 and NS31 to NS33 are connected to the ground selection line GSL in common.

The common source line CSL is connected to the NAND strings NS in common. For example, in an active region on the substrate 111, the first to fourth doping regions 311 to 314 are connected. For example, the first to fourth doping regions 311 to 314 are connected to an upper layer through a contact. The first to fourth doping regions 311 to 314 may be connected in common, at the upper layer.

As illustrated in FIG. 33, word lines WL having the same height are connected in common. Accordingly, when a specific word line WL is selected, all NAND strings NS connected to the specific word line WL are selected. The NAND strings NS of different rows are connected to different string selection lines SSL. Therefore, by selecting string selection lines SSL1 to SSL3, the NAND strings NS of an unselected row among NAND strings NS connected to the same word line WL may be separated from the bit lines BL1 to BL3. That is, by selecting the string selection lines SSL1 to SSL3, the row of NAND strings NS may be selected. Furthermore, by selecting the bit lines BL1 to BL3, the NAND strings NS of a selected row may be selected in row units.

In the each NAND string NS, a dummy memory cell DMC is provided. First to third memory cells MC1 to MC3 are provided between the dummy memory cell DMC and the ground selection line GST. Fourth to sixth memory cells MC4 to MC6 are provided between the dummy memory cell DMC and the string selection line SST. Hereinafter, it is assumed that the memory cells MC of the each NAND string NS are divided into memory cell groups by the dummy memory cell DMC. Among the divided memory cell groups, memory cells (for example, MC1 to MC3) adjacent to the ground selection transistor GST are called a lower memory cell group. Furthermore, among the divided memory cell groups, memory cells (for example, MC4 to MC6) adjacent to the string selection transistor SST are called an upper memory cell group.

The program sequence according to embodiments of the inventive concept may be applied to a flash memory device having a 3D structure. The flash memory device having a 3D structure according to embodiments of the inventive concept can decrease the coupling noise, the Vpass disturbance and/or the Vpgm disturbance with the program sequencer.

The flash memory device according to embodiments of the inventive concept can reduce the change of the threshold voltage that is caused by a coupling noise, the Vpass disturbance and/or the Vpgm disturbance.

The above-disclosed subject matter is to be considered illustrative and not restrictive, and the appended claims are intended to cover all such modifications, enhancements, and other embodiments, which fall within the scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A programming method for a nonvolatile memory device comprising multi-level memory cells (MLCs) arranged in a plurality of physical pages (PPs), each PP being respectively associated with one of N word lines (WLs) disposed in a consecutive arrangement order, the MLCs being further arranged in a plurality of logical pages (LPs), wherein each PP comprises a Most Significant Bit (MSB) LP and a Least Significant Bit (LSB) LP, the method comprising:
    performing a LSB programming operation programming all the LSB LPs, and thereafter performing a MSB programming operation programming all the MSB LPs, wherein during the LSB programming operation a selected MLC connected between a selected word line and selected bit line is programmed to a negative intermediate program state.

2. The method of claim 1, further comprising:
    applying a negative word line voltage to the selected word line, applying a power source voltage to the selected bit line, and applying a ground voltage to a common source line connected to the selected bit line while performing a program verification operation during the LSB programming operation.

3. The method of claim 1, further comprising:
    applying a grounded word line voltage to the selected word line, and applying a power source voltage to a common source line connected to the selected bit line while performing a program verification operation during the LSB programming operation.

4. The method of claim 1, further comprising:
applying a grounded word line voltage to the selected word line, applying a power source voltage to the selected bit line, and applying a positive bias voltage less than the power supply voltage to a common source line connected to the selected bit line while performing a program verification operation during the LSB programming operation.

5. The method of claim 4, wherein a level of the positive bias voltage is equal to an absolute value of a negative program verification voltage level used to discriminate between the erase state and the negative intermediate program state during the program verification operation.

6. The method of claim 1, wherein performing the LSB programming operation comprises:
during a LSB bit line setup period applying a ground voltage to the N word lines;
during a Vpass enable period applying a Vpass voltage to the N word lines; and thereafter,
during a LSB program execution period, continuing to apply the Vpass voltage to unselected word lines other than the selected word line while applying an iterative programming voltage to the selected word line, wherein each iterative application of the programming voltage comprises applying a negative verification voltage discriminating between an erase state and the negative intermediate program state.

7. The method of claim 1, wherein following the MSB programming operation the selected MLC is programmed to one of a group of data states consisting of; an erase state having an initial threshold voltage distribution, a first program state having a first threshold voltage distribution greater than that of the erase state, a second program state having a threshold voltage distribution greater than that of the first program state, and a third program state having a threshold voltage distribution greater than that of the second program state.

8. The method of claim 7, wherein at least the first program state is negative.

9. The method of claim 7, wherein performing the MSB programming operation comprises:
during a MSB bit line setup period applying a power supply voltage greater than a threshold voltage distribution of the intermediate program state to the N word lines;
during a Vpass enable period applying a Vpass voltage to the N word lines; and thereafter,
during a MSB program execution period, continuing to apply the Vpass voltage to unselected word lines other than the selected word line while applying an iterative programming voltage to the selected word line, wherein each iterative application of the programming voltage to the selected word line comprises;
applying a first program verification voltage discriminating between the initial threshold voltage distribution and the first voltage distribution,
applying a second program verification voltage discriminating between the first voltage distribution and the second voltage distribution, and
applying a third program verification voltage discriminating between the second threshold voltage distribution and the third voltage distribution,
wherein at least the first program verification voltage is negative.

10. The method of claim 9, wherein the first and second verification voltages are negative.

11. The method of claim 1, wherein the LSB programming operation comprises non-sequentially programming the LSB LPs in a non-sequential order other than the consecutive arrangement order of the N word lines, and the MSB programming operation comprises non-sequentially programming the MSB LPs in the non-sequential order.

12. The method of claim 11, wherein the non-sequential order comprises beginning with a lowest and first even word line, transitioning to each incrementally successive even word line through the arrangement order for all even word lines in the N word lines, and thereafter beginning with a next lowest and first odd word line, transitioning to each incrementally successive odd word line through the arrangement order for all odd word lines in the N word lines.

13. A programming method for a nonvolatile memory device comprising multi-level memory cells (MLCs) arranged in a plurality of physical pages (PPs), each PP being respectively associated with one of N word lines (WLs) disposed in a consecutive arrangement order, the MLCs being further arranged in a plurality of logical pages (LPs), wherein each PP comprises a Most Significant Bit (MSB) LP and a Least Significant Bit (LSB) LP, the method comprising:
performing a LSB programming operation sequentially programming each one of the LSB LPs according to the arrangement order of the N word lines, and thereafter performing a MSB programming operation programming all the MSB LPs, wherein during the LSB programming operation a selected MLC connected between a selected word line and selected bit line is programmed to a negative intermediate program state.

14. The method of claim 13, wherein the MSB programming operation comprises sequentially programming each one of the MSB LPs according to the arrangement order of the N word lines.

15. The method of claim 14, wherein performing the MSB programming operation comprises:
applying a ground voltage to all unselected word lines other than the selected word line during a MSB bit line setup period; and thereafter
applying an iterative programming voltage to the selected word line.

16. The method of claim 15, wherein applying the iterative programming voltage to the selected word line comprises applying a negative verification voltage during a program verification operation.

17. A programming method for a nonvolatile memory device comprising multi-level memory cells (MLCs) arranged in a plurality of physical pages (PPs), each PP being respectively associated with one of N word lines (WLs) disposed in a consecutive arrangement order, the MLCs being further arranged in a plurality of logical pages (LPs), wherein each PP comprises a Most Significant Bit (MSB) LP and a Least Significant Bit (LSB) LP, the method comprising:
performing a LSB programming operation programming all the LSB LPs, wherein during the LSB programming operation a selected MLC connected between a selected word line and selected bit line is programmed to a negative intermediate program state; and thereafter,
performing a MSB programming operation sequentially programming each one of the MSB LPs according to the arrangement order of the N word lines by applying a power source voltage having a level greater than a threshold voltage distribution for the intermediate program state to all unselected word lines other than the selected word line during a MSB bit line setup period, and thereafter applying an iterative programming voltage to the selected word line.

18. The method of claim 17, wherein applying the iterative programming voltage to the selected word line comprises applying a negative verification voltage during a program verification operation.

19. A programming method for a nonvolatile memory device comprising multi-level memory cells (MLCs) arranged in a plurality of physical pages (PPs), each PP being respectively associated with one of N word lines (WLs) disposed in a consecutive arrangement order, the MLCs being further arranged in a plurality of logical pages (LPs), wherein each PP comprises a Most Significant Bit (MSB) LP and a Least Significant Bit (LSB) LP, the method comprising:

performing a LSB programming operation programming all the LSB LPs by non-sequentially programming the LSB LPs in a non-sequential order other than the consecutive arrangement order of the N word lines; and thereafter, performing a MSB programming operation programming all the MSB LPs by non-sequentially programming the MSB LPs in the non-sequential order, wherein during the LSB programming operation a selected MLC connected between a selected word line and selected bit line is programmed to a negative intermediate program state, and the non-sequential order comprises beginning at a N/2 center word line, alternating between even LPs arranged incrementally above the center word line and odd LPs arranged incrementally below the center word line.

20. The method of claim 19, wherein performing the MSB programming operation comprises:

during a MSB bit line setup period applying a ground voltage to the N word lines, and applying a power supply voltage bit lines including a program bit line and an inhibited bit line, a common source line connected to the bit lines through respective ground selection transistors, and a ground selection line controlling the operation of the ground selection transistors;

during a Vpass enable period applying a Vpass voltage to the N word lines, continuing to apply the power supply voltage to the inhibited bit line and the common source line, and applying the ground voltage to the program bit line and the ground selection line; and thereafter, during a MSB program execution period, continuing to apply the power supply voltage to inhibited bit line, continuing to apply the grounded voltage to program bit line and the ground selection line, continuing to apply the power supply voltage to the common source line, and continuing to apply the Vpass voltage to unselected word lines other than the selected word line while applying an iterative programming voltage to the selected word line.

21. The method of claim 20, wherein each iterative application of the programming voltage to the selected word line comprises applying a negative verification voltage discriminating between an erase state and the negative intermediate program state.

22. The method of claim 19, wherein performing the MSB programming operation comprises:

during a MSB bit line setup period applying a power supply voltage to the N word lines, bit lines including a program bit line and an inhibited bit line, a common source line connected to the bit lines through respective ground selection transistors, and a ground selection line controlling the operation of the ground selection transistors;

during a Vpass enable period applying a Vpass voltage to the N word lines, continuing to apply the power supply voltage to the inhibited bit line and the common source line, applying a ground voltage to the program bit line and the ground selection line; and thereafter, during a MSB program execution period, continuing to apply the power supply voltage to inhibited bit line, continuing to apply the ground voltage to program bit line and the ground selection line, continuing to apply the power supply voltage to the common source line, and continuing to apply the Vpass voltage to unselected word lines other than the selected word line while applying an iterative programming voltage to the selected word line 23. The method of claim 22, wherein each iterative application of the programming voltage to the selected word line comprises applying a negative verification voltage discriminating between an erase state and the negative intermediate program state.

* * * * *